(12) United States Patent
Sacks et al.

(10) Patent No.: US 11,719,734 B1
(45) Date of Patent: *Aug. 8, 2023

(54) SYSTEMS, APPARATUSES, AND METHODS FOR AUTOMATED ROBOTIC TUNING

(71) Applicant: Cobham Advanced Electronic Solutions Inc., Arlington, VA (US)

(72) Inventors: James Scott Sacks, Pleasanton, CA (US); Baker M. Sharif, Santa Cruz, CA (US); Thomas Matthew Graves, Livermore, CA (US); Nicholas Aaron Vong, Elk Grove, CA (US)

(73) Assignee: CAES SYSTEMS LLC, Arlington, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/886,122

(22) Filed: Aug. 11, 2022

Related U.S. Application Data

(63) Continuation of application No. 17/886,032, filed on Aug. 11, 2022.

(51) Int. Cl.
*H04N 7/18* (2006.01)
*G01R 29/08* (2006.01)

(52) U.S. Cl.
CPC ......... *G01R 29/0871* (2013.01); *H04N 7/183* (2013.01)

(58) Field of Classification Search
CPC .................... G01R 29/0871; H04N 7/183
See application file for complete search history.

(56) References Cited

U.S. PATENT DOCUMENTS

| 2013/0021048 A1* | 1/2013 | Peng | G01R 31/2822 324/750.3 |
|---|---|---|---|
| 2014/0141726 A1* | 5/2014 | Schlub | H04W 24/00 455/67.12 |
| 2014/0347079 A1* | 11/2014 | Min | G01R 31/001 324/750.01 |

* cited by examiner

*Primary Examiner* — Giovanni Astacio-Oquendo
*Assistant Examiner* — Zannatul Ferdous
(74) *Attorney, Agent, or Firm* — Alston & Bird LLP

(57) ABSTRACT

Systems, devices, and associated methods are provided for testing and tuning radiofrequency (RF) modules. An example system includes a test station including an imaging device, a measurement device, and a robotic arm. The system may include a rotary stage coupled with the robotic arm, measurement probes disposed in the rotary stage and operably coupled with the measurement device, and tuning tips disposed in the rotary stage. The system may include a galvo scanner and laser to remove conductive material. In operation, the test station may perform a testing procedure on an RF module where the measurement probes generate testing data indicative of testing parameters. The test station may perform a tuning procedure on the RF module where a tuning tip or the laser modifies the RF module based on the testing parameters. The testing and tuning may be performed by a user, semi-autonomously, or autonomously.

20 Claims, 10 Drawing Sheets

SYSTEMS, APPARATUSES, AND METHODS FOR AUTOMATED ROBOTIC TUNING

REFERENCE TO RELATED APPLICATION

This application is a continuation of U.S. patent application Ser. No. 17/886,032, filed Aug. 11, 2022, the entire contents of which is incorporated by reference herein.

TECHNOLOGICAL FIELD

Example embodiments of the present disclosure relate generally to testing and tuning of module and, more particularly, to the testing and tuning of RF modules with an automated robotic tuning system.

BACKGROUND

Electromagnetic radiation (e.g., radio waves, microwaves, etc.) is used in a variety of applications, such as radio and television broadcasting, wireless networking, satellite communication, navigation, aerospace applications, and the like. In these applications RF waves (e.g., electromagnetic radiation) are used to transmit information (e.g., data) between components. By way of example, RF modules utilizing RF waves to communicate between an input port and an output port may be components in the RF portions of commercial or aerospace systems and the like. The manufacture, testing, and tuning of RF modules is difficult and has previously been done by individual technicians. The inventors have identified numerous deficiencies with existing technologies in the field, the remedies for which are the subject of the embodiments described herein.

BRIEF SUMMARY

Various embodiments described herein relate to systems, apparatuses, and methods for testing and tuning modules, such as RF modules.

In some example embodiments, a system for tuning a radiofrequency (RF) module is provided comprising: a test station comprising: an imaging device; a measurement device; a robotic arm; a galvo scanner; a laser; a rotary stage coupled with the robotic arm; one or more measurement probes supported by the rotary stage and operably coupled with the measurement device; and one or more tuning tips supported by the rotary stage. In operation, the test station is configured to: receive a first input via the input device of a location on the RF module at which to perform a testing procedure; perform the testing procedure on an RF module received by the test station in which the one or more measurement probes generate testing data indicative of one or more testing parameters of the RF module; receive a second input via the input device of a tuning procedure; and perform the tuning procedure on the RF module in which: a tuning tip of the one or more tuning tips is selected on the rotary stage; and the RF module is modified by the selected tuning tip based on the one or more testing parameters.

In some exemplary embodiments, the test station, in performing the testing procedure, is further configured to: utilize the robotic arm to position the one or more measurement probes at one or more locations on the RF module; and generate testing data indicative of one or more testing parameters of the RF module at the one or more locations.

In some exemplary embodiments, the test station, in performing the tuning procedure, is configured to modify the RF module at the location with the selected tuning tip based on the testing data indicative of one or more testing parameters of the RF module at the location.

In some exemplary embodiments, the imaging device is configured to generate image data indicative of at least the location of the RF module for rendering via a display.

In some exemplary embodiments, the test station, in performing the tuning procedure, is further configured to: compare the testing data with one or more parameter thresholds; and modify the RF module in an instance in which the testing data fails to satisfy the one or more parameter thresholds.

In some exemplary embodiments, the test station is further configured to: generate modified testing data indicative of one or more testing parameters of the modified RF module; and further modify the RF module in an instance in which the modified testing data fails to satisfy the one or more parameter thresholds.

In some exemplary embodiments, the test station is further configured to iteratively modify the RF module until the modified testing data indicative of one or more testing parameters of the modified RF module satisfies the one or more parameter thresholds.

In some exemplary embodiments, the tuning procedure comprises an additive tuning procedure in which metal is deposited on the RF module.

In some exemplary embodiments, the tuning procedure comprises an additive tuning procedure in which epoxy is deposited on the RF module.

In some exemplary embodiments, the tuning procedure comprises a subtractive tuning procedure in which laser ablation removes at least a portion of the RF module.

In some example embodiments, a method for testing and tuning a radiofrequency (RF) module, the method comprising: providing an RF module to a test station comprising: an imaging device; a measurement device; a robotic arm; a galvo scanner; a laser; a rotary stage coupled with the robotic arm; one or more measurement probes disposed in the rotary stage and operably coupled with the measurement device; and one or more tuning tips disposed in the rotary stage; receiving a first input via the input device of a location on the RF module at which to perform a testing procedure; performing a testing procedure on the RF module received by the test station in which the one or more measurement probes generate testing data indicative of one or more testing parameters of the RF module; receiving a second input via the input device of a tuning procedure; and performing a tuning procedure on the RF module comprising: selecting, on the rotary stage, a tuning tip from amongst the one or more tuning tips; and modifying the RF module by the selected tuning tip based on the determined one or more testing parameters.

In some exemplary embodiments, the method, in performing the testing procedure, further comprises: utilizing the robotic arm to position the one or more measurement probes at one or more locations on the RF module; and generating testing data indicative of one or more testing parameters of the RF module at the one or more locations.

In some exemplary embodiments, the method, in performing the tuning procedure, further comprises modifying the RF module at the location with the selected tuning tip based on the testing data indicative of one or more testing parameters of the RF module at the location.

In some exemplary embodiments, the method further comprising generating, via the imaging device, image data indicative of at least the location of the RF module for rendering via a display.

In some exemplary embodiments, the method, in performing the tuning procedure, further comprises: comparing the testing data with one or more parameter thresholds; and modifying the RF module in an instance in which the testing data fails to satisfy the one or more parameter thresholds.

In some exemplary embodiments, the method further comprises: generating modified testing data indicative of one or more testing parameters of the modified RF module; and further modifying the RF module in an instance in which the modified testing data fails to satisfy the one or more parameter thresholds.

In some example embodiments, the method further comprises iteratively modifying the RF module until the modified testing data indicative of one or more testing parameters of the modified RF module satisfies the one or more parameter thresholds.

In some exemplary embodiments, the tuning procedure comprises an additive tuning procedure comprising depositing metal on the RF module.

In some exemplary embodiments, the tuning procedure comprises an additive tuning procedure comprising depositing epoxy on the RF module.

In some exemplary embodiments, the tuning procedure comprises a subtractive tuning procedure comprising removing via laser ablation at least a portion of the RF module.

In some example embodiments, a system for tuning a radiofrequency (RF) module is provided comprising: a test station comprising: an imaging device; a measurement device; a robotic arm; a galvo scanner; a laser; a display; and an input device; a rotary stage coupled with the robotic arm; one or more measurement probes supported by the rotary stage and operably coupled with the measurement device; and one or more tuning tips supported by the rotary stage. In operation, the test station is configured to: render, via the display, a testing suggestion; receive an input via the input device of a location on the RF module at which to perform a testing procedure in response to the testing suggestion; perform the testing procedure on the RF module at the location in which the one or more measurement probes generate testing data indicative of one or more testing parameters of the RF module; and perform a tuning procedure on the RF module at the location in which: a tuning tip of the one or more tuning tips is selected on the rotary stage; and the RF module is modified by the selected tuning tip based on the one or more testing parameters.

In some exemplary embodiments, the test station, in performing the testing procedure, is further configured to utilize the robotic arm to position the one or more measurement probes at the location on the RF module associated with the input.

In some exemplary embodiments, the imaging device is configured to generate image data associated with the RF module and the testing suggestion, and wherein the display is configured to render the image data.

In some exemplary embodiments, the input via input device is responsive to the image data rendered via the display.

In some exemplary embodiments, the image data is configured to render on the display a plurality of locations of the RF module, such that the input via the input device comprises a selection of the location from amongst the plurality of locations of the RF module.

In some exemplary embodiments, the plurality of locations of the RF module are determined based on a testing algorithm.

In some exemplary embodiments, the test station, in performing the tuning procedure, is further configured to: compare the testing data with one or more parameter thresholds; and modify the RF module in an instance in which the testing data fails to satisfy the one or more parameter thresholds.

In some exemplary embodiments, the test station is further configured to: generate modified testing data indicative of one or more testing parameters of the modified RF module; and further modify the RF module in an instance in which the modified testing data fails to satisfy the one or more parameter thresholds.

In some exemplary embodiments, the test station is further configured to iteratively modify the RF module until the modified testing data indicative of one or more testing parameters of the modified RF module satisfies the one or more parameter thresholds.

In some exemplary embodiments, the tuning tip is selected based on a tuning algorithm.

In some exemplary embodiments, the tuning procedure comprises an additive tuning procedure in which metal is deposited on the RF module.

In some exemplary embodiments, the tuning procedure comprises an additive tuning procedure in which epoxy is deposited on the RF module.

In some exemplary embodiments, the tuning procedure comprises a subtractive tuning procedure in which laser ablation removes at least a portion of the RF module.

In some example embodiments, a method for testing and tuning a radiofrequency (RF) module is provided comprising: providing an RF module to a test station comprising: an imaging device; a measurement device; a robotic arm; a galvo scanner; a laser; a display; an input device; a rotary stage coupled with the robotic arm; one or more measurement probes disposed in the rotary stage and operably coupled with the measurement device; and one or more tuning tips disposed in the rotary stage; rendering, via the display, a testing suggestion; receiving an input via the input device of a location on the RF module at which to perform a testing procedure in response to the testing suggestion; performing the testing procedure on the RF module at the location in which the one or more measurement probes generate testing data indicative of one or more testing parameters of the RF module; and performing a tuning procedure on the RF module at the location in which: a tuning tip of the one or more tuning tips is selected on the rotary stage; and the RF module is modified by the selected tuning tip based on the one or more testing parameters.

In some exemplary embodiments, the method, in performing the testing procedure, further comprises utilizing the robotic arm to position the one or more measurement probes at the location on the RF module associated with the input.

In some exemplary embodiments, the method further comprises: generating, via the imaging device, image data associated with the RF module and the testing suggestion; and rendering, via the display, the image data.

In some exemplary embodiments, the input via input device is responsive to the image data rendered via the display.

In some exemplary embodiments, the image data is configured to render on the display a plurality of locations of the RF module, such that the input via the input device comprises a selection of the location from amongst the plurality of locations of the RF module.

In some exemplary embodiments, the tuning procedure comprises an additive tuning procedure comprising depositing metal or epoxy on the RF module.

In some exemplary embodiments, the tuning procedure comprises an subtractive tuning procedure comprising removing via laser ablation at least a portion of the RF module.

In some example embodiments, a system for tuning a radiofrequency (RF) module is provided comprising: a test station comprising: an imaging device; a measurement device; a robotic arm; a galvo scanner; a laser; a rotary stage coupled with the robotic arm; one or more measurement probes supported by the rotary stage and operably coupled with the measurement device; and one or more tuning tips supported by the rotary stage. In operation, the test station is configured to: perform a testing procedure on an RF module received by the test station according to a testing algorithm in which the one or more measurement probes generate testing data indicative of one or more testing parameters of the RF module; and perform a tuning procedure on the RF module according to a tuning algorithm in which: a tuning tip of the one or more tuning tips is selected on the rotary stage; and the RF module is modified by the selected tuning tip.

In some exemplary embodiments, the testing algorithm determines one or more locations of the RF module at which to perfume the testing procedure.

In some exemplary embodiments, the test station, in performing the testing procedure, is further configured to utilize the robotic arm to position the one or more measurement probes at the one or more locations on the RF module determined by the testing algorithm.

In some exemplary embodiments, in performing the tuning procedure, the tuning algorithm determines the tuning tip.

In some exemplary embodiments, the test station, in performing the tuning procedure, is further configured to: compare the testing data with one or more parameter thresholds; and modify the RF module according to the tuning algorithm in an instance in which the testing data fails to satisfy the one or more parameter thresholds.

In some exemplary embodiments, the test station is further configured to: generate modified testing data indicative of one or more testing parameters of the modified RF module; and further modify the RF module according to the tuning algorithm in an instance in which the modified testing data fails to satisfy the one or more parameter thresholds.

In some exemplary embodiments, the test station is further configured to modify the testing algorithm or the tuning algorithm based on a simulation.

In some exemplary embodiments, the test station is further configured to modify the testing algorithm or the tuning algorithm based on a machine learning model.

In some exemplary embodiments, the tuning procedure comprises an additive tuning procedure in which epoxy is deposited on the RF module.

In some exemplary embodiments, the tuning procedure comprises a subtractive tuning procedure in which laser ablation removes at least a portion of the RF module.

In some example embodiments, a method for testing and tuning a radiofrequency (RF) module is provided comprising: providing an RF module to a test station comprising: an imaging device; a measurement device; a robotic arm; a galvo scanner; a laser; a rotary stage coupled with the robotic arm; one or more measurement probes disposed in the rotary stage and operably coupled with the measurement device; and one or more tuning tips disposed in the rotary stage; performing a testing procedure on an RF module received by the test station according to a testing algorithm in which the one or more measurement probes generate testing data indicative of one or more testing parameters of the RF module; and performing a tuning procedure on the RF module according to a tuning algorithm in which: a tuning tip of the one or more tuning tips is selected on the rotary stage; and the RF module is modified by the selected tuning tip.

In some exemplary embodiments, the testing algorithm determines one or more locations of the RF module at which to perfume the testing procedure.

In some exemplary embodiments, the method, in performing the testing procedure, further comprises utilizing the robotic arm to position the one or more measurement probes at the one or more locations on the RF module determined by the testing algorithm.

In some exemplary embodiments, in performing the tuning procedure, the tuning algorithm determines the tuning tip.

In some exemplary embodiments, the method, in performing the tuning procedure, further comprises: comparing the testing data with one or more parameter thresholds; and modifying the RF module according to the tuning algorithm in an instance in which the testing data fails to satisfy the one or more parameter thresholds.

In some exemplary embodiments, the method further comprises: generating modified testing data indicative of one or more testing parameters of the modified RF module; and further modifying the RF module according to the tuning algorithm in an instance in which the modified testing data fails to satisfy the one or more parameter thresholds.

In some exemplary embodiments, the method further comprises modifying the testing algorithm or the tuning algorithm based on a simulation.

In some exemplary embodiments, the method further comprises modifying the testing algorithm or the tuning algorithm based on a machine learning model.

In some exemplary embodiments, the tuning procedure comprises an additive tuning procedure comprising depositing metal or epoxy on the RF module.

In some exemplary embodiments, the tuning procedure comprises a subtractive tuning procedure comprising removing via laser ablation at least a portion of the RF module.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will be appreciated that the scope of the disclosure encompasses many potential embodiments in addition to those here summarized, some of which will be further described herein.

BRIEF DESCRIPTION OF THE DRAWINGS

Having described certain example embodiments of the present disclosure in general terms above, reference will now be made to the accompanying drawings. The components illustrated in the figures may or may not be present in certain embodiments described herein. Some embodiments may include fewer (or more) components or operations than those illustrated in the figures.

DETAILED DESCRIPTION

Figure 1:
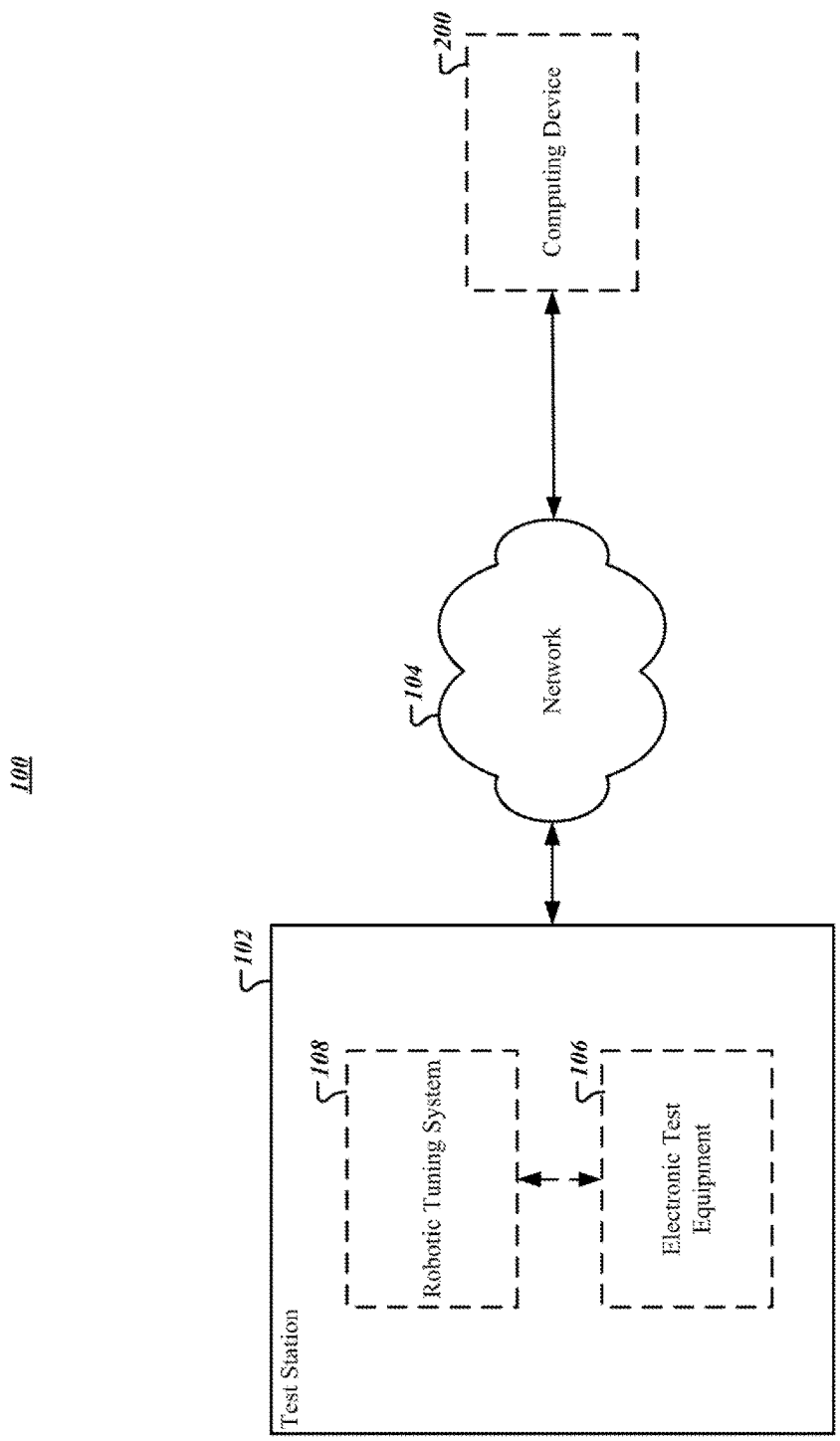
FIG. 1 illustrates an example Automated Robotic Tuning (ART) system in accordance with some example embodiments described herein.

Some embodiments of the present disclosure will now be described more fully herein with reference to the accompanying drawings, in which some, but not all embodiments of the disclosure are illustrated. Indeed, this disclosure may be embodied in many different forms and should not be construed as limited to the embodiments set forth herein; rather, these embodiments are provided so that this disclosure will satisfy applicable legal requirements. Like numbers refer to like elements throughout. Additionally, as would be evident to one of ordinary skill in the art in light of the present disclosure, use of the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broad terms such as comprising, comprises, includes, and having should be understood to provide support for narrower terms such as consisting of, consisting essentially of, and comprised substantially of.

As used herein, the phrases "in one embodiment," "according to one embodiment," "in some embodiments," "in various embodiments," and the like generally refer to the fact that the particular feature, structure, or characteristic following the phrase may be included in at least one embodiment of the present disclosure. Thus, the particular feature, structure, or characteristic may be included in more than one embodiment of the present disclosure such that these phrases do not necessarily refer to the same embodiment.

As used herein, the term "communication" may be selectively used to describe or otherwise define the conduit, waveguide, traces, communication medium, etc. by which electromagnetic radiation (e.g., RF radiation, electrical signals, etc.) may propagate. By way of example, RF modules as described herein may include one or more input ports, output ports, and/or module components based on the intended application or implementation of the RF module. As such, the present disclosure contemplates that communication between these components may refer to the ability of these components to transmit and/or receive signals (e.g. electrical signals, RF radiation, etc.), such as transmitted via one or more traces, channels, etc. such as described herein with respect to an RF module.

Overview

As described herein, electromagnetic radiation of various types, such as RF radiation (e.g., radio waves, microwaves, etc.), may be used in radio and television broadcasting, wireless networking, satellite communication, navigation, aerospace applications, and the like, in which radio waves (e.g., electromagnetic radiation) are used to transmit and/or receive information (e.g., data, signals, etc.) between components. In order to effectively transmit information, such as in RF portions of systems, RF modules may be used. These modules may support various components (e.g., mixers, amplifiers, filters, switches, attenuators, delay lines, limiters, detectors, etc.) based on the intended application of the RF module. Each of these components as well as the connections between components may be specifically designed to provide specific functions (e.g., transfer functions) between input and output ports operably connected via these components. While embodiments associated with RF modules are described herein, it will be readily appreciated that the system described herein may be applied to more than RF modules, including, but not limited to, high-speed digital and power applications Such additional applications may include the use of modules, which may be tested and tuned as described herein.

The testing and tuning of modules is difficult and has previously been done by individual technicians. In testing and tuning using conventional systems, a human technician or operator is, for example, often tasked with testing and analyzing the various parameters of a manufactured RF module, such as by supplying electrical signals to the RF module and measuring one or more parameters of the RF module responsive to these input signals (e.g., gain, insertion loss, reflection, input/output impedance, etc.). To carry out these tasks, an operator or technician may use one or more handheld instruments and/or probes to measure a parameter. The results of this technician-based testing may indicate that modification to the RF module is required in order to ensure of the RF module meets a specific transfer function, such as in instances in which the parameters of the RF module fall outside of an acceptable range or fail to meet a threshold. In conventional systems the technician may also be tasked with tuning the RF module to address the unacceptable parameters by modifying the RF module by hand, including, but not limited to, applying epoxy daubs, removing one or more portions of an electrical component, ablating portions of electrical traces, etc. Testing and tuning is a delicate operation, particularly due to the precise and small locations a testing or tuning instrument must be able to be placed at to perform an operation without otherwise modifying or damaging the RF module. Due to the limited dexterity associated with human technicians and the variability amongst technicians, the ability to properly test and tune the RF modules, and the reproducibility of testing and tuning, is limited by the individual technician.

In order to address these issues and others, the embodiments of the present disclosure provide for an automated robotic tuning (ART) system that facilitates the testing and/or tuning of RF modules. By way of example, the ART system implementations described herein may include imaging devices, measurement devices, and a robotic arm to facilitate the accurate testing and subsequent tuning via modification of RF modules. In some embodiments, a robotic arm may position a measurement probe(s) at particular locations on the RF module (e.g., as determined by technician input, by an algorithm, or the like) to generate testing data that may serve as the basis for further tuning operations. A rotary stage of the robotic arm that houses a plurality of measurement probes and tuning tips may select a particular tuning tip based on the generated testing data and may subsequently modify the RF module with a selected tuning tip (e.g., a tuning tip used to pin transfer or a tuning tip to daub epoxy in particular location in the module). The robotic arm may include or be used with a laser to perform one or more tuning operations, including ablating, removing material, or welding multiple materials in the RF module. The performance of the tuning operations may also leverage testing algorithms and tuning algorithms, which may be iteratively updated based on operations performed by the ART system. In various embodiments, the ART system provides technicians with a system that facilitates a robotic system to carry out a technician's commands with repeatability and accuracy, that facilitates a semi-autonomous robotic system to test and tune RF modules, or that facilitates a full autonomous robotic system for testing and tuning an RF module with no or minimal technician input. In various embodiments, the ART system may also collect data regarding testing and tuning operations to be used to further improve and provide a consistent process for tuning an RF module, including through simulations and machine learning. Thus, as described herein, various embodiments may operate to improve the accuracy of RF module testing to further improve the accuracy and precision associated with tuning of the RF module.

Automated Robotic Tuning (ART) System

With reference to FIGS. 1-3D, an example ART system 100 of the present disclosure is illustrated.

FIG. 1 illustrates an example ART system 100 in accordance with some example embodiments described herein. As illustrated in FIG. 1, the ART system 100 may include a test station 102 that includes a robotic tuning equipment 108 and/or electronic test equipment 106 that are connected with a computing device 200. As described herein, the embodiments of the ART system 100 are used in the context of testing and tuning RF modules such that the test station 102 may include components directed to performing testing operations (e.g., electronic test equipment 106) and/or components directed to performing testing and tuning operations (e.g., robotic tuning equipment 108). In some embodiments, some of these components may be dedicated to testing, some may be dedicated to tuning, and some may be for both testing and tuning. The testing equipment 106 may include one or more measurement devices operably coupled to a measurement probe. In some embodiments, the test station 102 may be formed as an integrated system of collection of components in that the robotic tuning equipment 108 and the electronic test equipment 106 may be physically positioned in single location. In other words, the functionality of the robotic tuning equipment 108 and the functionality of the electronic test equipment 106 may be, in whole or in part, provided as an integrated test station 102. In other embodiments, at least a portion of the components or functionality of the robotic tuning equipment 108 may be located separate from a portion of the components or functionality of the electronic test equipment 106. In such an embodiment, the robotic tuning equipment 108 and the electronic test equipment 106 may be connected via physical networking cables, over a network (e.g., network 104), or the like. For the sake of brevity and clarity of description, the embodiments of the ART system 100 are described herein with reference to a test station 102 that includes, leverages, or is otherwise capable of performing the functionality associated with the robotic tuning equipment 108 and electronic test equipment 106 (e.g., without specific reference to the robotic tuning equipment 108 and/or electronic test equipment 106).

The test station 102 may include, comprise, or otherwise be communicably coupled with a computing device 200. As illustrated in FIG. 1 and as described herein, the computing device 200 may be located separate from the test station 102 and connected to the test station 102 over a network 104. In such an example, the computing device 200 may operate as a remote server or other remote device, such that the computing device 200 based processes or operations described herein are performed remote from the test station 102. In other embodiments, the test station 102 may include, in whole or in part, the computing device 200 such that at least a portion of the processes or operations described herein are performed local to the test station 102. In other words, the present disclosure contemplates that the test station 102 may comprise a computing device 200 as part of the robotic tuning equipment 108, the electronic test equipment 106, and/or any part of the ART system 100. For example, the computing device 200 may operate as an input device capable of receiving one or more instructions from an operator or technician. Additionally or alternatively, the computing device 200 may operate as a display device in that one or more imaging devices (e.g., imaging device(s) 114 in FIG. 3A) may generate image data that is subsequently rendered by the display of the computing device 200.

Example Computing Device

The ART system 100 may comprise or otherwise be communicably coupled with a computing device 200. The computing device 200 may be configured to at least partially control operation of one or more components of the ART system 100, including but not limited to the robotic arm 110, rotary stage 118, and/or any component illustrated in FIGS. 1-3D. As described with reference to FIGS. 5-8, for example, the computing device 200 may be configured to facilitate, semi-autonomously perform, and/or autonomously perform operations of a testing procedure on an RF module and/or facilitate, semi-autonomously perform, and/or autonomously perform operations of a tuning procedure. By way of a non-limiting example, the computing device 200 may be configured to cause a robotic arm to position one or more measurement probes at selected locations on a RF module so as to generate testing data indicative of one or more testing parameters of the RF module. Additionally or alternatively, the computing device 200 may be configured to cause the robotic arm to tune the RF module by modifying the RF module via a selected tuning tip in response to the testing parameters.

Figure 2:
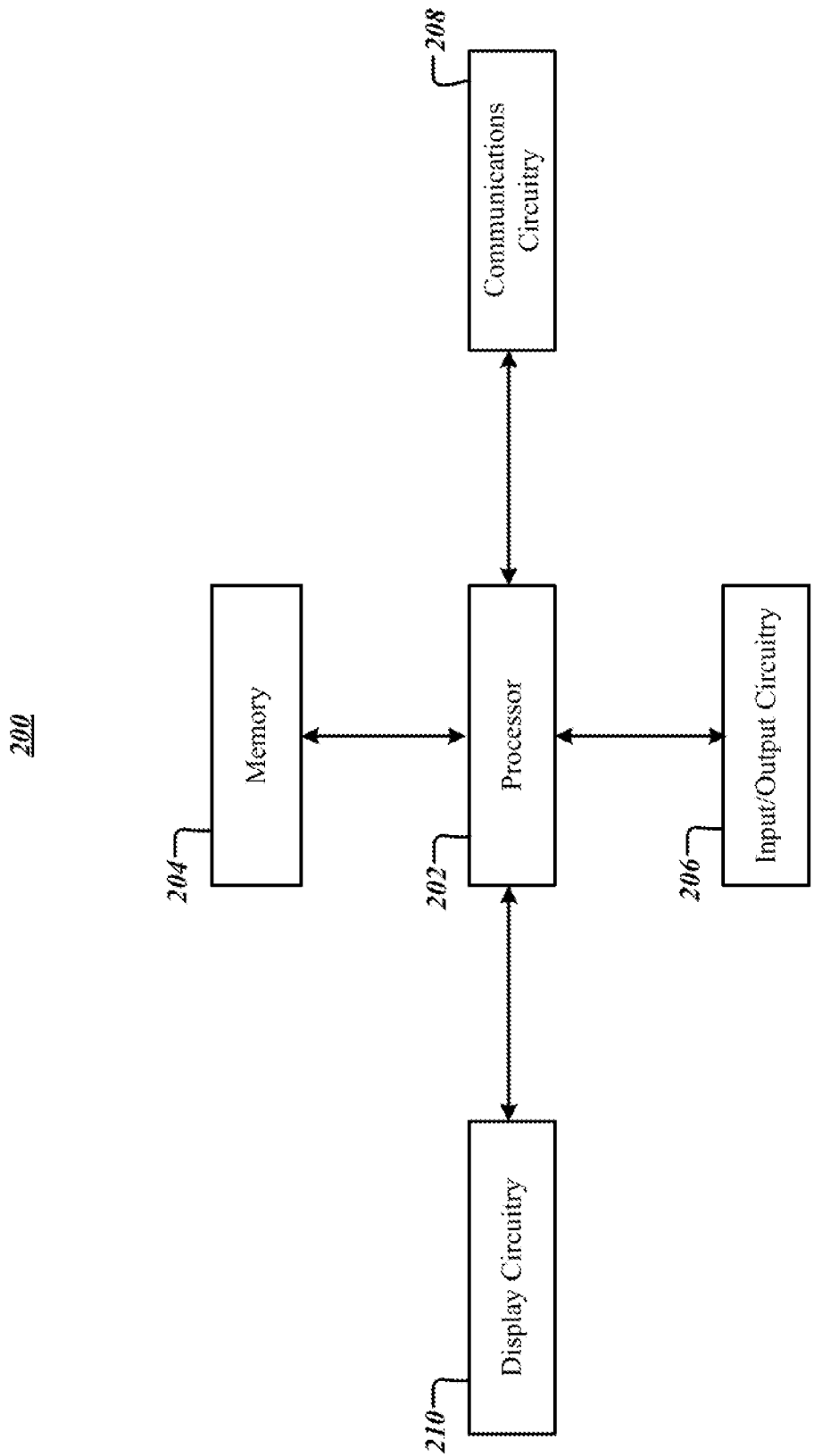
FIG. 2 illustrates an example computing device configured to, in whole or in part, perform various operations described herein.

FIG. 2 illustrates an example computing device configured to, in whole or in part, perform various operations described herein. In order to perform these operations, the computing device 200 may, as illustrated in FIG. 2, include a processor 202, a memory 204, input/output circuitry 206, communications circuitry 208, and/or display circuitry 210. The computing device 200 may be configured to execute the operations described herein, including communicating with one or more components of the ART system 100 to execute an operation.

Although components 202-210 are described in some cases using functional language, it should be understood that the particular implementations necessarily include use of particular hardware. It should also be understood that certain of these components 202-210 may include similar or common hardware. For example, two sets of circuitry may both use the same processor 202, memory 204, communications circuitry 208, display circuitry 210, or the like to perform their associated functions, such that duplicate hardware is not required for each set of circuitry. The term "circuitry" as used herein includes particular hardware configured to perform the functions associated with respective circuitry described herein. While the term "circuitry" should be understood broadly to include hardware, in some embodiments, the term "circuitry" may also include software for configuring the hardware. For example, although "circuitry" may include processing circuitry, storage media, network interfaces, input/output devices, and the like, other elements of the computing device 200 may provide or supplement the functionality of particular circuitry.

As described herein, in some embodiments, various elements or components of the circuitry of the computing device 200 may be housed within the test station 102. In other embodiments, the computing device 200 may be located separate from the test station 102. It will be understood in this regard that some of the components described in connection with the computing device 200 may be housed in one or more of the devices of FIG. 1, while other components are housed in another of these devices or in another device not expressly illustrated in FIG. 1.

In some embodiments, the processor 202 (and/or co-processor or any other processing circuitry assisting or otherwise associated with the processor) may be in communication with the memory 204 via a bus for passing information among components of the computing device 200. The memory 204 may be non-transitory and may include, for example, one or more volatile and/or non-volatile memories. In other words, the memory may be an electronic storage device (e.g., a non-transitory computer readable storage medium). The memory 204 may be configured to store information, data, content, applications, instructions, or the like, for enabling the computing device 200 to carry out various functions or operations in accordance with example embodiments of the present disclosure described herein.

The processor 202 may be embodied in a number of different ways and may, for example, include one or more processing devices configured to perform independently. Additionally, or alternatively, the processor 202 may include one or more processors configured in tandem via a bus to enable independent execution of instructions, pipelining, and/or multithreading. The use of the term "processing circuitry" may be understood to include a single core processor, a multi-core processor, multiple processors internal to the computing device, and/or remote or cloud processors.

In an example embodiment, the processor 202 may be configured to execute instructions stored in the memory 204 or otherwise accessible to the processor 202. Alternatively or additionally, the processor 202 may be configured to execute hard-coded functionality. As such, whether configured by hardware or by a combination of hardware with software, the processor 202 may represent an entity (e.g., physically embodied in circuitry) capable of performing operations according to an embodiment of the present disclosure while configured accordingly. Alternatively, as another example, when the processor 202 is embodied as an executor of software instructions, the instructions may specifically configure the processor 202 to perform the algorithms and/or operations described herein when the instructions are executed.

The computing device 200 further includes input/output circuitry 206 that may, in turn, be in communication with processor 202 to provide output to a technician and to receive input from a technician, user device, input device, output device, or another source. In some embodiments, the input/output circuitry 206 may also include additional functionality including a keyboard, a mouse, a joystick, a touch screen, touch areas, soft keys, a microphone, a speaker, or other input/output mechanisms. The processor 202 and/or user interface circuitry comprising the processor 202 may be configured to control one or more functions of a display through computer program instructions (e.g., software and/or firmware) stored on a memory accessible to the processor (e.g., memory 204, and/or the like).

In some embodiments, the computing device 200 may include display circuitry 210 configured to render data for viewing by a technician or operator associated with the any portion of the ART system 100. For example, the computing device 200 may be configured to receive image data (e.g., generated by imaging device(s) 114) indicative or otherwise associated with one or more pixels within a field of view (FOV) of the imaging device(s). The computing device may be configured to render the image data on a display associated with the computing device 200 and may, in some embodiments, receive instructions based on this image data, such as instructions from a technician regarding subsequent operations associated with testing or tuning an RF module. By way of a non-limiting example, the computing device 200 may be configured to render image data that displays one or more locations of a RF module for view by a technician.

The communications circuitry 208 may be any means such as a device or circuitry embodied in either hardware or a combination of hardware and software that is configured to receive and/or transmit data from/to a network and/or any other device, circuitry, or module in communication with the computing device 200. In this regard, the communications circuitry 208 may include, for example, a network interface for enabling communications with a wired or wireless communication network. For example, the communications circuitry 208 may include one or more network interface cards, antennae, buses, switches, routers, modems, and supporting hardware and/or software, or any other device suitable for enabling communications via a network. Signals transmitted and/or received by the communications circuitry 208 may be transmitted by the computing device 200 using any of a number of wireless personal area network (PAN) technologies, such as Bluetooth®, infrared wireless (e.g., IrDA), ultra-wideband (UWB), induction wireless transmission, or the like. In addition, it should be understood that these signals may be transmitted using Wi-Fi, Near Field Communications (NFC), Worldwide Interoperability for Microwave Access (WiMAX) or other proximity-based communications protocols.

Example Test and Tuning Station

Figure 3A:
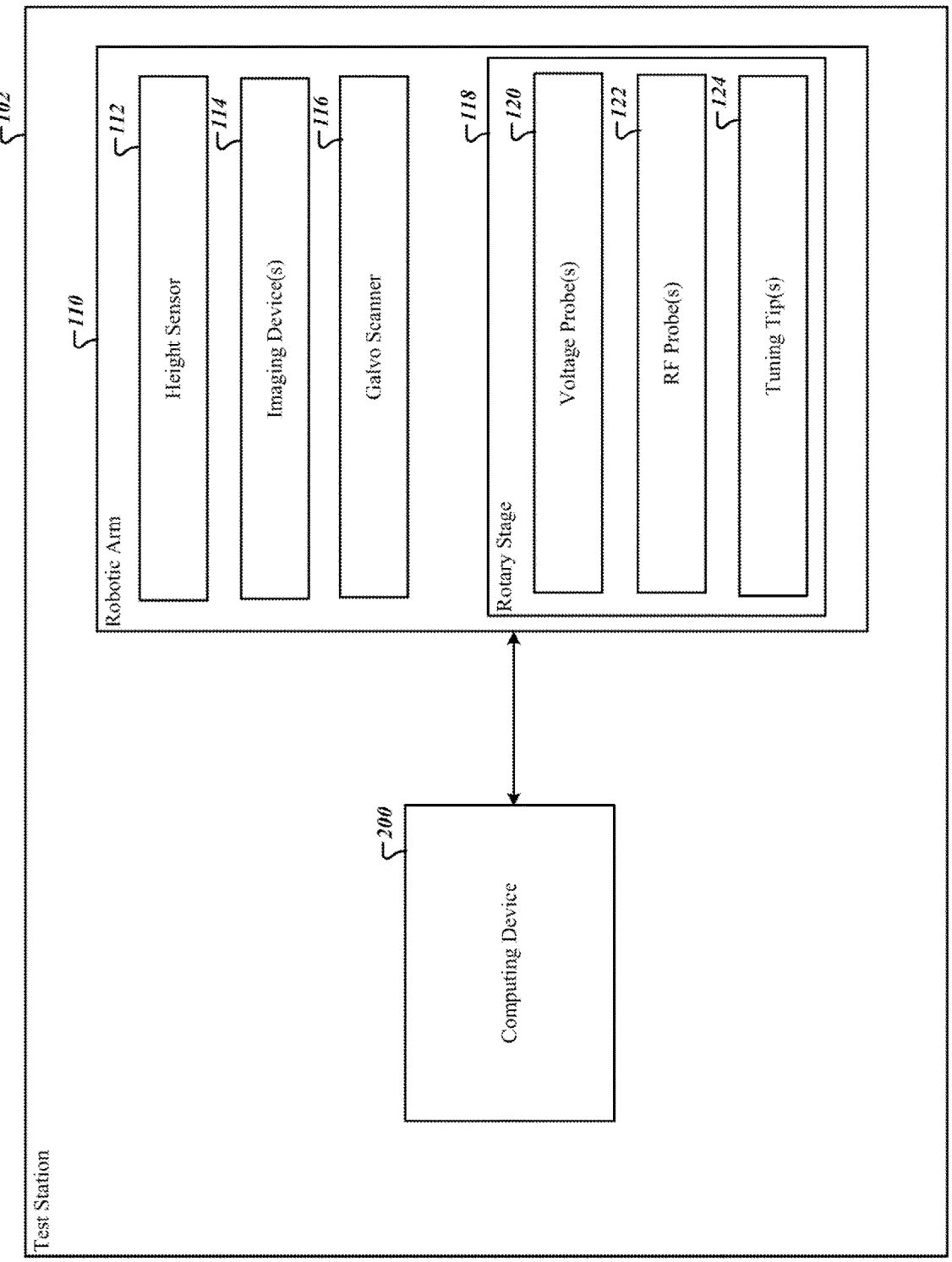
FIG. 3A illustrates an example test station of the ART system including components of an example robotic arm in accordance with some example embodiments described herein.
Figure 3B:
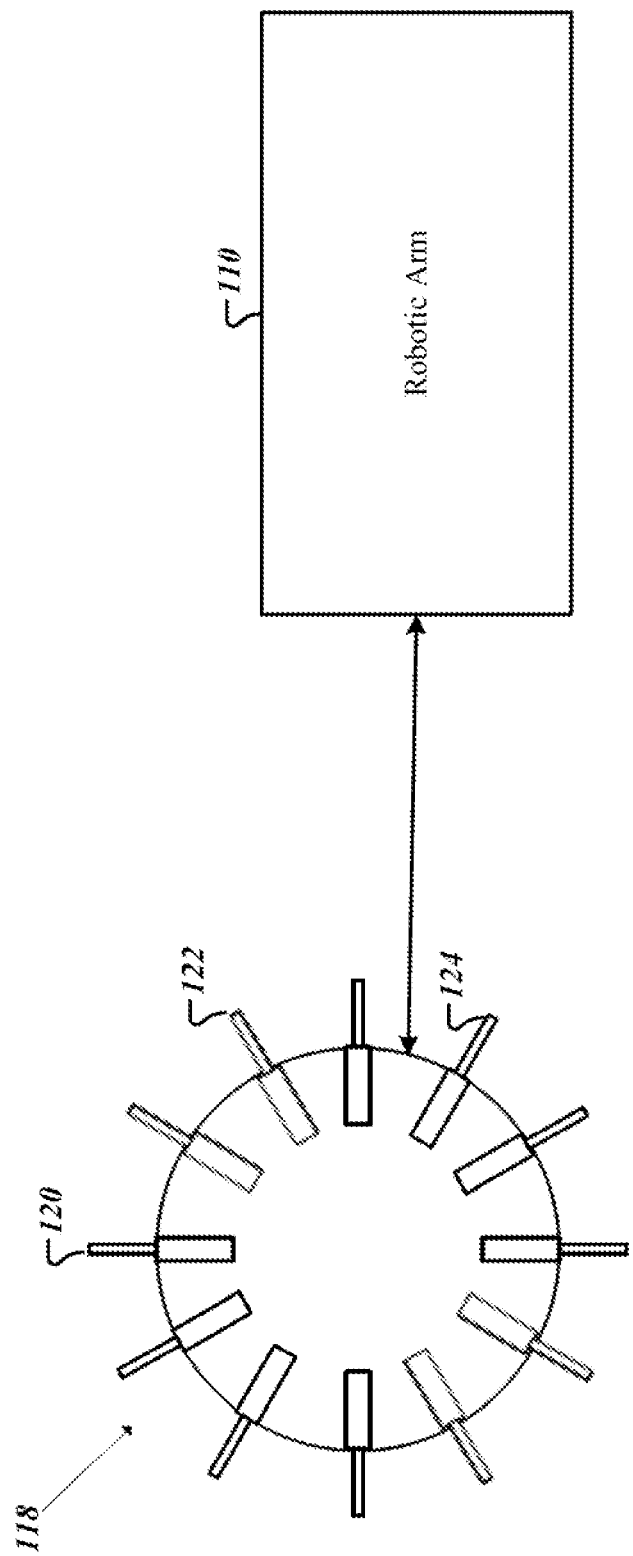
FIG. 3B illustrates an example robotic arm and rotary stage in accordance with some example embodiments described herein.

With reference to FIGS. 3A-3B, an example implementation of the test station 102 is illustrated with an example computing device 200 communicably coupled with a robotic arm 110. The test station 102 may define a physical location within which testing procedures and/or tuning procedures may occur. In some instances, the test station 102 may refer to a designated or bounded physical area within which the robotic tuning equipment 108 (and its associated components) and the electronic test equipment 106 (and its associated components) are contained.

FIG. 3A illustrates an example test station of the ART system including components of an example robotic arm in accordance with some example embodiments described herein. The test station may include various structural components configured to support one or more of the components illustrated in FIG. 3A. Furthermore, in such an embodiment, the structural components may be configured to allow movement of one or more of these components within the test station 102. By way of example, the robotic arm 110 described herein may be supported by one or more motorized or otherwise actuatable gantry components that allow for movement of the robotic arm 110 in three-dimensional space (e.g., X, Y, and Z space) within the test station 102. In various embodiments, the test station 102 may include a test bed to place a device under test (e.g., RF module) on during testing. The test bed may be insulated (e.g., thermally insulated, electrically insulated, etc.), leveled, self-leveling, and/or have a suspension (e.g., air suspension), any of which may be used to minimize or eliminate undesired environment elements from being introduced into a test (e.g., shock, raise in temperature, drop in temperature, etc.). Additionally or alternatively, the test bed may include a hood, such as a vapor hood, which may direct or redirect harmful or toxic vapors to safe location, exhaust, or collection point.

In other embodiments, one or more of the components illustrated in FIGS. 3A-3B may be positioned separate from the physical location of other components. By way of example, one or more circuitry components of the computing device 200 may be housed by a remote server. As such, the present disclosure contemplates that the test station 102 may include any number of disparate physical locations within which one or more components illustrated in FIGS. 3A-3B may be located.

With continued reference to FIG. 3A, the robotic arm 110 of the present disclosure may include a height sensor 112 configured to generate data indicative of the relative position of the robotic arm 110. In some embodiments, the height sensor 112 may be configured to generate data indicative of the distance (e.g., height) between the robotic arm 110 (e.g., the measurement probes and/or tuning tips described herein after) and the RF module (e.g., RF module 400 in FIG. 4). The height sensor 112 may include any sensor component configured to sense relative positioning including, but not limited to, optical sensors, vibration based sensors, ultrasonic sensors, capacitance based sensors, radar, conductivity/resistance based sensors, and or the like. In other words, the present disclosure contemplates that the height sensors 112 may include any sensor capable of determine the relative position between objects. For example, a height sensor may be configured to determine a position within 5 microns. The relative position of the height sensor 112, or a plurality of height sensors 112, on the robotic arm 110 may be precisely determined so as to accurately detect the distance between various locations of the robotic arm 110, including probes and tuning tips, and a RF module being tested or tuned. The height sensor may be used with the robotic arm and a measurement probe or tuning tip to place the measurement probe or tuning tip at a specified location of a RF module 400 to perform a testing or tuning operation.

Additionally, the present disclosure contemplates that the test station 102 may include any number of robotic arms 110 and, as such, may similarly include any number of associated height sensors 112.

A robotic arm 110 may further include one or more imaging devices 114 configured to capture images and to generate image data indicative of a field of view (FOV) associated with the imaging device 114. Example imaging devices 114 may include high definition (HD) camera that may capture an image before, during, or after performance of testing and/or tuning procedures or operations described herein and generate image data capable of being rendered on a display. In some embodiments, an image may be captured before, during, and after each testing and/or tuning operation. The imaging device 114 may be configured to generate image data representative of different types of tuning operations (e.g., epoxy daubs, laser ablation, pulling jumpers, etc.). Image data may be used to create a coordinate mapping of the modules and a coordinate mapping of the individual sub-circuits. Although described herein with reference to an HD camera, the present disclosure contemplates that any imaging device, such as a thermal imaging camera, an IR imager, a hyperspectral camera/and/or the like may be used. Furthermore, the relative positioning of the imaging device 114 on the robotic arm 110 may vary based on the intended application of the robotic arm 110. In some embodiments, a plurality of imaging devices 114 may be collectively used to capture a plurality of images of an example RF module during a testing and/or tuning operation. The imaging device (s) 114 may be mounted so as to view the example RF module unobstructed (e.g., a side mounted camera or the like). The imaging devices(s) 114 may include a side-mounted camera, which may capture images as one or more testing and/or tuning operations are performed. The side-mounted camera may allow for an unobstructed view of the testing and/or tuning operations.

In some embodiments, the robotic arm 110 may only include imaging devices 114 as opposed to or in lieu of the height sensor(s) 112. For example, the computing device 200 may be configured to leverage image processing techniques in order to determine the relative distance between the robotic arm 110 and a RF module being tested or tuned based on the image data generated by the imaging devices 114.

In some embodiments, the robotic arm 110 may further include a galvo scanner 116 configured to facilitate one or more laser-based operations. The robotic tuning equipment 108 may include a laser that may be used for laser ablation and/or weld tuning. The galvo scanner 116 may define a motorized mirror mount (e.g., a rotatable low-inertia mirror) to position a laser beam with high precision and repeatability. Some tuning procedures may leverage a laser for ablating at least a portion of the RF module (e.g., a trace, portion of a thin film resistor, etc.) so as to modify one or more electrical components. Some tuning procedures may leverage a laser for weld tuning at least a portion of the RF module by welding two or more materials together to change the electrical characteristics.

As illustrated in FIG. 3B, the robotic arm may further be operably coupled with or otherwise capable of accessing a rotary stage 118. The rotary stage 118 may define a housing within which measurement probes and/or tuning tips may be housed. The rotary stage 118 may include one or more springs to control the amount of pressure a measurement probe or tuning tip applies to an RF module. Such probes may be used with electronic test equipment 106 and/or robotic tuning equipment 108 to perform a testing and/or tuning operation. Examples of such probes and tips include, but are not limited to, voltage probes 120, RF probes 122, and/or tuning tips 124. As illustrated in FIG. 3B, in some embodiments, the rotary stage 118 may define a cylindrical housing within which multiple voltage probes 120, RF probes 122, and/or tuning tips 124 are radially positioned. In some embodiments, the rotary stage 118 may define twelve (12) slots, and each slot is configured to house a respective one of the probes (e.g., voltage probes 120, RF probes 122, etc.) and/or tuning tips 124.

In some embodiments, the rotary stage 118 may be physically supported by the robotic arm 110 within the test station 102. In other embodiments, the robotic arm 110 may be actuated in three-dimensional space to access the rotary stage 118 while not necessarily supporting the rotary stage 118.

In various embodiments, one or more measurement probes of the rotary stage 118 may be in communication with electronic test equipment 106 to generate testing data, specifically to one or more measurement devices in the electronic test equipment 106. Such measurement devices may include, but are not limited to, oscilloscopes, network analyzers, meters (e.g., digital multimeters, digital voltage meter, etc.), cameras, signal generators, power sources, etc. The one or more probes of the rotary stage 118 may communicate with the measurement devices of the electronic test equipment 106 to apply or measure an electronic signal to test an RF module.

A voltage probe 120 may refer to a bipolar sensor configured to measure the electrical potential in circuitry components. For example, a voltage probe 120 may be configured to generate data indicative of a voltage reading when electrical current is supplied to particular locations of an example RF module. Although described herein with reference to a voltage probe 120, the present disclosure contemplates that the rotary stage 118 may include any number of probes configured to generate data indicative of any electrical property associated with the example RF module A RF probe 122 may be configured to generate data indicative of RF voltages within RF components or modules. For example, a RF probe 122 may be configured to convert a high frequency signal into a corresponding DC voltage for further evaluation as described herein after. Similar to the voltage probes 120, the present disclosure contemplates that the RF probes 122 may be configured to generate data indicative of any RF property, parameters, or the like associated with an example RF module. In various embodiments, the RF probe 122 may be an RF probe with center conductor and ground contact(s), which may be connected to a coaxial cable for transmission of sample RF signals to test equipment 106. In various embodiments, RF probe 122 may be mounted directly to the robotic arm 110, such as with a mounting bracket or and an additional Z-axis stage. By way of example, the voltage probes 120 and/or the RF probes 122 may be configured to measure and generate testing data indicative of one or more parameters of a RF module, including but not limited to S-parameters, gain, insertion loss, input return loss, output return loss, reverse gain, reverse isolation, reflection, input impedance, output impedance, time domain reflectometry, $3^{rd}$ Order Intercept Point (IP3), noise figure, phase noise, spurious noise, 1 dB compression, power, DC Voltage, resistance (ohms), among others. In some embodiments, various test data may be generated at various discrete frequencies and/or in frequency sweeps by varying an input signal associated with one or more testing operations.

Figure 3C:
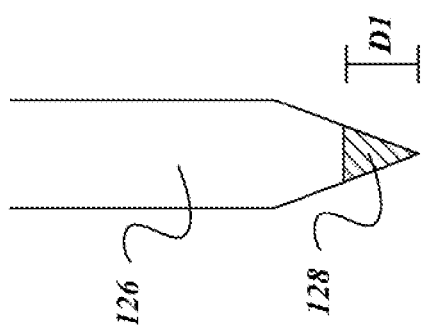
FIGS. 3C and 3D illustrate example tuning tips in accordance with some example embodiments described herein.
Figure 3D:
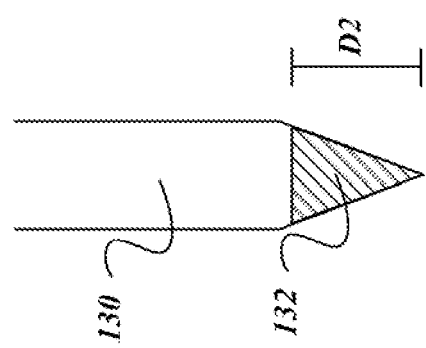

With reference to FIGS. 3C-3D, these figures illustrate example tuning tips 126, 130. These figures illustrate tuning tips 126, 130 for use with additive tuning operations. Each of the figures illustrate a tuning tip 126, 130, but each tuning tip has a varying amount of daubing material (e.g., metallization 128, 132) that may be used with a daubing operation. In a daubing operation, the amount of the metal daubed onto an RF module may be based on the amount of daubing material on the tuning tip. FIG. 3C illustrates a first amount of daubing material 128 of tuning tip 126 that has been dipped in daubing material to a depth of D1, and FIG. 3D illustrates a second amount 132 of tuning tip 130 that has been dipped in daubing material to a depth of D2. As the amount of daubing material is increased, the amount deposited onto the RF module is increased. The height at which the tuning tip is above the substrate during a daubing operation may be controlled by the robotic tuning equipment 108 to control the amount of daubing material daubed onto the substrate.

FIG. 3C illustrates a first tuning tip 126. The first tuning tip 126 may be made out of ceramic. The first tuning tip may be configured to use a small amount of metallization 128, at least comparative to tuning tip 130 of FIG. 3D. The metallization may be gold plating, which in FIG. 3C may be for a distance of D1. In some embodiments, D1 may be 0.020 inches. In various embodiments, tuning tip 126 with metallization 128 may be utilized for simulating a possible addition or removal of electrically conductive material in a location of interest in the RF module, such as during a testing or tuning operation. For example, if the presence of the tuning tip 126 improves the electrical characteristics of the RF module then the ART system 100 may perform a tuning operation to add an equivalent an amount of electrically conductive material, such as with a daub of conductive epoxy. As another example, if the presence of the tuning tip 126 degrades the electrical characteristics of the RF module then the ART system 100 may perform a tuning operation to remove an equivalent amount of metallization, such as with laser ablation.

FIG. 3D illustrates a second tuning tip 130. The second tuning tip 130 may also be made out of ceramic. The second tuning tip may be configured to use a large amount of metallization 128, at least comparative to tuning tip 128 of FIG. 3C. The metallization may be gold plating, which in FIG. 3D may be for a distance of D2. In some embodiments, D2 may be 0.040 inches. In various embodiments, tuning tip 130 with metallization 132 may be utilized for simulating a possible addition or removal of electrically conductive material in a location of interest in the RF module, such as during a testing or tuning operation. If the presence of the tuning tip 130 improves the electrical characteristics of the RF module then the ART system 100 may perform a tuning operation to add an equivalent an amount of electrically conductive material, such as with a daub of conductive epoxy. If the presence of the tuning tip 130 degrades the electrical characteristics of the RF module then the ART system 100 may perform a tuning operation to remove an equivalent amount of metallization, such as with laser ablation.

A rotatory stage 118 may include multiple tuning tips 124. While the tuning tips 124 illustrated in FIGS. 3C and 3D vary in the amount of metallization, it will be readily appreciated that the tuning tips 124 may vary in size, such as the width of the tuning tip, the length of the tuning tip, the angle of the point of the tuning tip, etc. Variations in the size of the tuning tip 124 may allow for varying the amount and/or size of the daub deposited by the tuning tip. Additionally, or alternatively, variations in tuning tips 124 may allow for varying the amount of electrically conductive material simulated for possible addition or removal in the RF module, which may be used to determine the amount of electrically conductive material that may be added or removed. In some embodiments, each of the tuning tips 124 may include differing amounts of metallization. Controlling the amounts of metallization may allow for control of the amount of metal to be deposited, or daubed, onto an RF module or for control of the amount of metal to use in simulating the electrical performance of the RF module with the addition or removal of electrically conductive material.

The amount of daubing material to use with a particular tuning tip may be controlled by operation of the robotic arm 110. In some embodiments, a test station 102 may include a reservoir of daubing material (e.g., liquid gold plating, liquid silver plating, epoxy) and a tuning tip may be dipped into the reservoir to a controlled depth. The reservoir may also include one or more heaters or heating elements to keep the metal at a specific viscosity. The depth to dip a tuning tip into the reservoir may be known by utilizing the height sensor 112 of the robotic arm 110 in conjunction with knowing the location of the end of the tuning tip 124. By operating the robotic arm 110 to select a tuning tip 124 and then dip the tuning 124 into the reservoir, a controlled amount of daubing material may be added to the tuning tip 124. Then, subsequently and as described herein, an additive tuning operation may modify a RF module by adding a daub of daubing material to the RF module to tune the RF module.

The tuning tips 124 may also include a tip for subtractive tuning (not depicted). In various embodiments, a tuning tip for subtractive tuning may include a blade, hook, heating element, etc., which may be used for slicing, pulling apart, or cutting one or more portions of an RF module (e.g., one or more jumpers or traces).

Example RF Module

Figure 4:
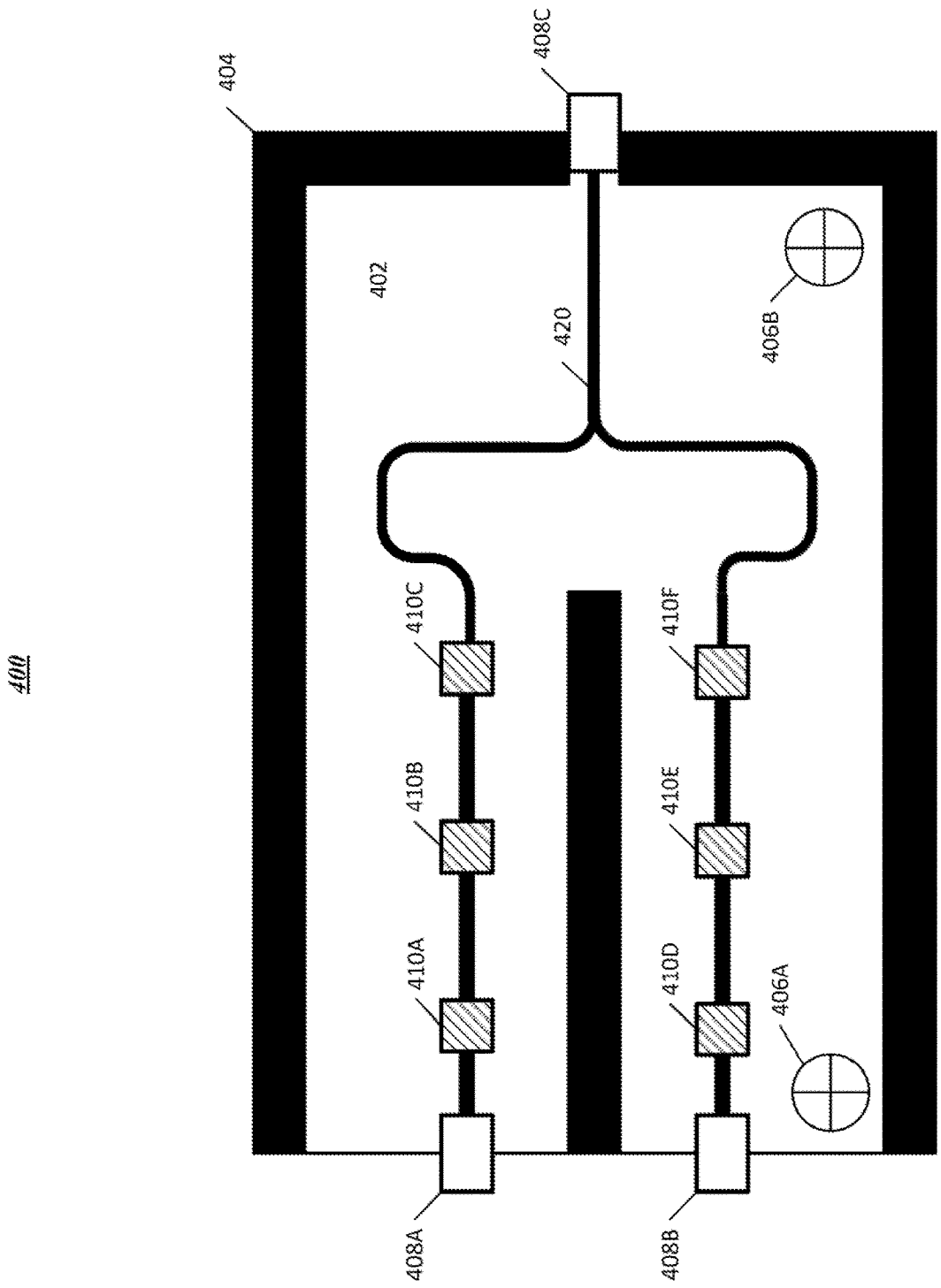
FIG. 4 illustrates an example RF module in accordance with some example embodiments described herein.

FIG. 4 illustrates an exemplary RF module 400 in accordance with some embodiments discussed herein. The RF module 400 may include a substrate 402, one or more traces 420 deposited or layered on the substrate 402, ports 408 (e.g., input ports 408A, 408B and output port 408C) connected via one or more traces, electrical components 410 (e.g., monolithic microwave integrated circuit ("MMIC"), resistors, capacitors, filters, etc.), RF module walls 404, one or more fiducials 406, and/or connectors connecting electrical components and/or traces (e.g., wire bonds, jumpers, tracers, thin film resistor ladders, etc.) (not depicted). One or more RF modules may be connected by ports 408, such as an input port and an output port, to create an RF assembly. The exemplary RF module 400 illustrated in FIG. 4 includes substrate 402, RF module walls 404, two (2) fiducials 406A, 406B, two (2) input ports 408A, 408B, one (1) output port 408C, and six (6) electrical components 410A, 410B, 410C, 410D, 410E, and 410F.

In various embodiments, the substrate 402 may be surrounded by RF module walls 404 such that the substrate 402 is completely or substantially surrounded. Alternatively, one or more portions of the RF module 400 may not be completely surrounded by RF module walls 404, which may create one or more openings.

In various embodiments, the fiducials 406A, 406B may operate as a visual indicator that is associated with a specific location of the substrate 402 relative to the remainder of the RF module 400. The fiducials 406A, 406B may be used in conjunction with an imaging device 114 as described herein, such as a camera and image recognition system, to identify or locate a specific location on the RF module 400. In operation, the fiducials 406A, 406B may be used to measure distances from the fiducials 406A, 406B, or part of the fiducials 406A, 406B, to another location on the RF module 400. The fiducials 406A, 406B may be or may include a specific symbol that contains and/or is associated with additional information, such as a QR code, allowing for the determination of additional information about or uniquely identifying the RF module 400 (e.g., a serial number, a model number, a manufacturing date, etc.). In various embodiments with more than one fiducials 406A, 406B, the fiducials may each be the same or may be different (e.g., including different symbols or data). For example, the fiducials 406A, 406B may contain distinct data in each fiducial to separately identify the fiducial 406A from fiducial 406B. Alternative, each of the fiducials 406A, 406B may be identical.

In some embodiments, one or more fiducials 406A, 406B may, during a testing or tuning operations, operate as reset or cardinal points by which operations of the testing or tuning procedure may be calibrated. By way of example, fiducials 406A, 406B may be precisely located on the RF module such that the positioning of one or more other components for the RF module 400 are measured relative to the location of fiducials 406A, 406B. As such, the robotic arm 110 may be positioned proximate to the fiducials 406A, 406B and view the fiducials 406A, 406B, such as via the imaging device(s) 114, and determine its position relative the RF module 400 before performing any testing or tuning operations to the RF module. In various embodiments, one fiducial 406A may be used, and the fiducial 406A may include one or more data allowing for a determination or redetermination of a two-dimensional space. In various embodiments, two fiducials 406A, 406B may be used, which may allow for a determination or a redetermination of a two-dimensional space, such as determining axes in an X-Y space.

The ports 408, such as input ports and/or output ports, may refer to a connector (e.g., coaxial connector, pin connector, etc.) for attaching external connections to the RF module 400. As would be evident in light of the present disclosure, connections may be directly to another RF module 400 or may be used with a connector, such as a cable. An electrical signal applied to RF module 400 may be input via either input port 408A or 408B and output to output port 408C. Such signals may include one or more test signals used to test an RF module, including used to apply a signal that may be measured by a measurement probe on the rotary stage 118. The traces 420 may transmit the electrical signals between their connections. In various embodiments, the traces 420 transmit and modify the electrical signals transmitted, which may include modifying electrical signals due to the physical shape and/or size of the traces 420. The wavelength of an RF signal changes with frequency and, thus, the shape and size of a trace may impact an RF signal transmitted via a trace 420 as the frequency of a signal changes. In various embodiments, the shape and/or size of traces 420 may be tuned by additive or subtractive tuning. Additive tuning may include, but is not limited to, adding material to a trace or on to the substrate, such as adding epoxy or metal, which may change the electrical properties of the trace 420 and/or how an electrical signal propagates along a trace 420. Subtractive tuning may include, but is not limited to, ablating or removing trace material, such as with a laser or scribing tool. The tuning may change the electrical properties of the trace 420, which may change how the electrical signal propagates along a trace 420. In various embodiments, this may be correlated with the frequency of the electrical signal applied to the RF module 400. The operations described herein further describe these modifications to the RF module 400.

In FIG. 4, the input ports 408A, 408B are connected to the output ports 408C via traces 420 and electrical components 410. The electrical components 410 may be one or more resistor, capacitor, inductor, MMIC, etc. In various embodiments, MMICs may include, but are not limited to, amplifiers, mixers, switches, transistors, etc. Although illustrated and described herein with an example RF module having a particular selection of components, the present disclosure contemplates that the RF module 400 may include any number of electrical components 410 in any combination or configuration based on the intended application of the RF module 400. In other words, the operations described herein may be applicable to any number of RF modules 400 as part of an RF assembly or otherwise without limitation.

Example Operations

The ART system 100 may perform one or more procedures and/or operations as described herein to test and/or tune RF modules. FIGS. 5-8 illustrate example procedures and/or operations that may be performed by the ART system, including operations to facilitate the use of the ART system 100 by an operator or technician, to allow for semiautonomous testing and/or tuning, and to allow for fully autonomous testing and/or tuning. In various embodiments, the use of an ART system 100 may allow for a technician or operator to use the ART system 100 to test and/or tune an RF module 400 using precise and repeatable operations while generating testing data and/or tuning data. In various embodiments, the ART system 100 may provide for semiautonomous testing and/or tuning with the ART system 100 guiding a technician or operator through one or more testing and/or tuning operations with suggestions. In some embodiments, the ART system 100 may provide for autonomous testing and/or tuning where a technician or operator is not involved, though some embodiments may have an indication for a technician or operator to intervene, such as an alert or alarm. The ART system, in its various embodiments, includes improvements over technician based testing and tuning as described herein.

Figure 5:
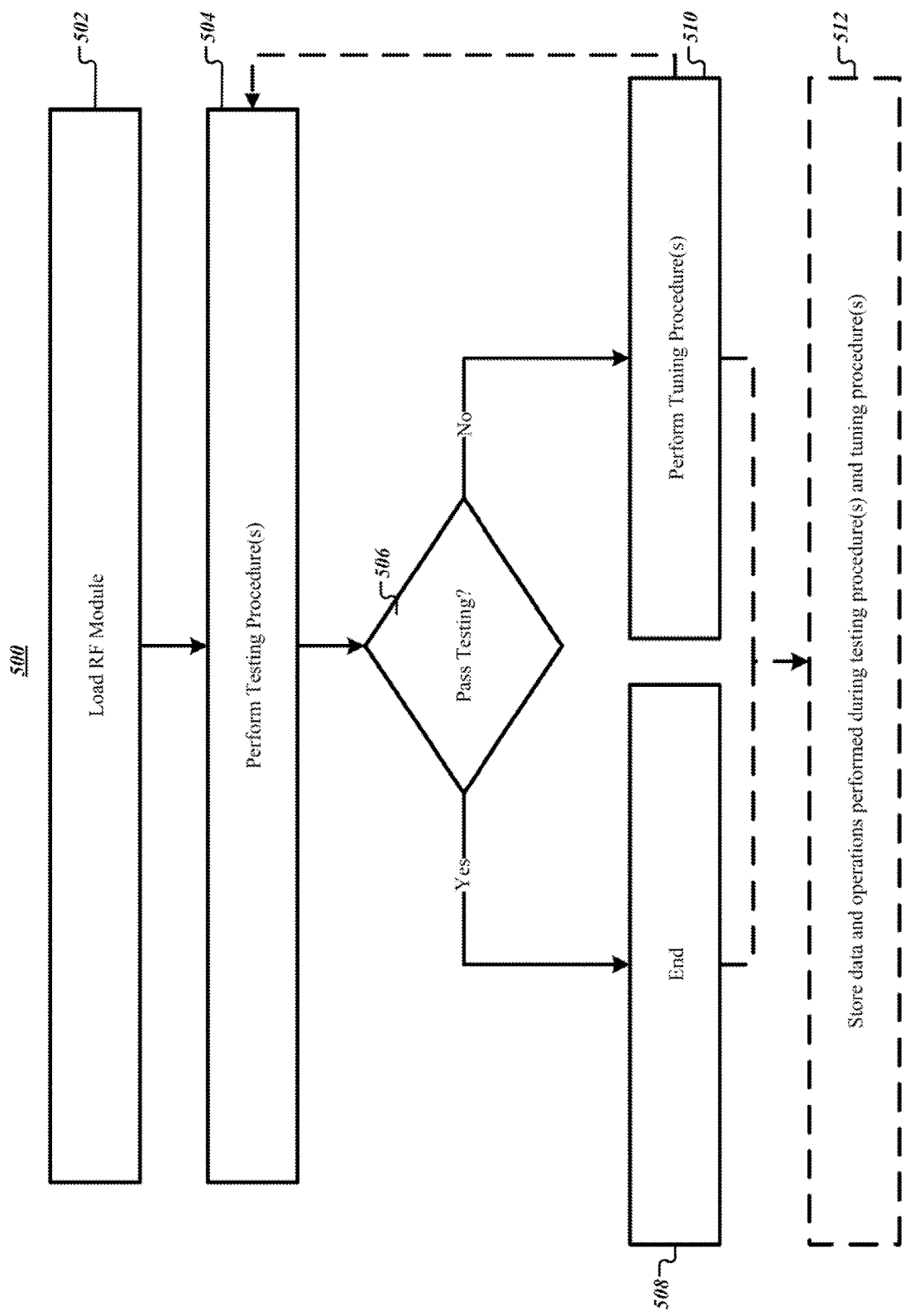
FIG. 5 illustrates an example method of testing and tuning an RF module in accordance with some example embodiments described herein.

FIG. 5 illustrates an example method of testing and tuning an RF module in accordance with some example embodiments described herein.

At operation 502, an RF module may be loaded to the ART system. An RF module may be manually loaded by a technician or may be automatically loaded by the ART system, such as with an automated loader or the like. During the loading, or prior to one or more testing and/or tuning operations, one or more of the ports (e.g., input ports and/or output ports) may be connected to one or more measurement devices of the electronic test equipment 106. In various embodiments, the connected measurement device(s) may provide one or more signals to the RF module that will be used during testing.

In various embodiments, as an RF module is loaded, but before any testing or tuning operations, one or more images may be captured of the RF module, such as with an imaging device 114. In various embodiments, the captured images may be rendered to a display to present a technician with a close up view of one or more portions of an RF module. In various modules, such a presentation to a technician may be live (i.e., in real time). In various embodiments, the one or more images may be used by the ART system 100 along with testing data generate or update one or more testing algorithms and/or tuning algorithms.

In various embodiments, and during or concurrent with a loading of an RF module, one or more parameters to test for, tests to execute, or types of modifications to perform may be input to the ART system 100. These inputs may be input by a technician or may be automatically input or loaded by the ART system 100, such as from an algorithm. For example, the ART system may determine from one or more images captured by an imaging device 114 of one or more fiducials 406A, 406B of an RF module. One or more of the fiducials 406A, 406B may be associated with one or more of the inputs and/or identification of one or more testing and/or tuning operations to be performed. This may be determined by one or more identifiers (e.g., serial numbers) associated or in one or more of the fiducials 406A, 406B, which may be recognized visually, such as by optical character recognition or the like. The ART system 100 may also use the input to determine one or more operations to store data associated with testing and/or tuning, including but not limited to images to captures and/or testing data, including before and after various testing and/or tuning operations.

At operation 504, the ART system 100 may perform a testing procedure. In various embodiments, a testing procedure may include one or more operations that may test an RF module 400 for one or more parameters, such as those described herein. A testing operation may cause electronic test equipment 106 to generate one or more signals to be applied to a RF module 400 to be measured by a measurement device of the ART system 100. Various operations may include testing an RF module 400 using only the ports (e.g., input ports 408A, 408B and output ports 408C), such as by applying a signal and measuring a response. Various operations may include using one or more measurement probes (e.g., 120, 122, 124). To take a measurement with a measurement probe, the measurement probe may be positioned at a specific location on the RF module 400, such as by a technician's input to the ART system 100 or by the ART system 100 moving a measurement probe according to a testing algorithm.

In various embodiments, and in addition to measuring a signal, a test operation may include varying one or more environmental characteristics to simulate an environmental condition(s) an RF module 400 may experience. The ART system 100 may include varying, for example, temperature and/or humidity, such as by lowering or raising temperature and/or humidity.

At operation 506, the ART system 100 may determine if the RF module 400 passes one or more tests. The determination of passing of test may include if a measured parameter tested is above or below a parameter threshold or within or is outside of a range associated with a parameter. For example, the ART system 100 may test for a noise parameter, and the RF module 400 under test may pass if the noise is below a threshold. In another example, the resistance of a circuit may be tested for, and the RF module 400 under test may pass if the resistance is measured within a range, such as a range that allows for manufacturing tolerances.

In various embodiments, the ART system 100 may determine if a test for each parameter is passed individually or, if after a plurality of parameters have been tested for, the RF module 400 passes testing for the plurality of parameters.

At operation 508, the ART system 100 may end the testing and tuning procedures. For example, if an RF module 400 passes all of the testing associated with the RF module 400, then the ART system 100 may end the tests and not perform any tuning procedures. In various embodiments, when an RF module 400 is determined to have passed testing then the RF module 400 may be unloaded and another may be loaded, such as by a technician or an automated loader. In various embodiments, once an RF module 400 is determined to have passed testing, the ART system 100 may store testing data and any tuning data as described herein.

At operation 510, the ART system may perform a tuning procedure, which may include one or more tuning operations. If an RF module 400 is determined not to pass one or more tests, the ART system 100 may perform tuning operations associated with tuning the RF module 400 to address the parameter associated with the test failed. Such tuning operations may be performed according to input from a technician or according to one or more algorithms, such as described herein. Such tuning operations may include additive and/or subtractive tuning.

In various embodiments, after one or more tuning operations, which may be after each tuning operation, one or more tests may be performed to determine if the RF module 400 passes the test. Thus, after operation 510 is performed, the ART system 100 may iterate operation 504, including performing one or more tests. If the tuned RF module 400 does not pass one or more tests, one or more additional tuning operations may be performed.

At operation 512, the ART system 100 may store data and/or operations performed during the testing procedure(s) and tuning procedure(s). Data may be stored before and/or after each operation, including inputs received by the ART system 100 from a technician and/or an algorithm. The stored data may include one or more images. In various embodiments, the stored data may include metadata, such as, but not limited to, sequence order numbers, time stamps, RF module 400 probe and tune locations, and/or indications of associated operations. Data associated with one or more tuning operations may include testing data of a modified RF module 400 and if a tuning operation caused a parameter previously associated with a failed test to, after the tuning, be associated with passing a test, which may be characterized as a successful tune of the parameter and/or the RF module 400.

In various embodiments, the ART system 100 may include more than one test station 102 that may be used to test and tune RF modules 400. The metadata may include which test station 102 and/or technician was associated with one or more testing and/or tuning operations.

The testing and tuning procedures of FIG. 5 may be executed in each of a technician guided procedures, semi-autonomous procedures, and fully autonomous procedures.

Figure 6:
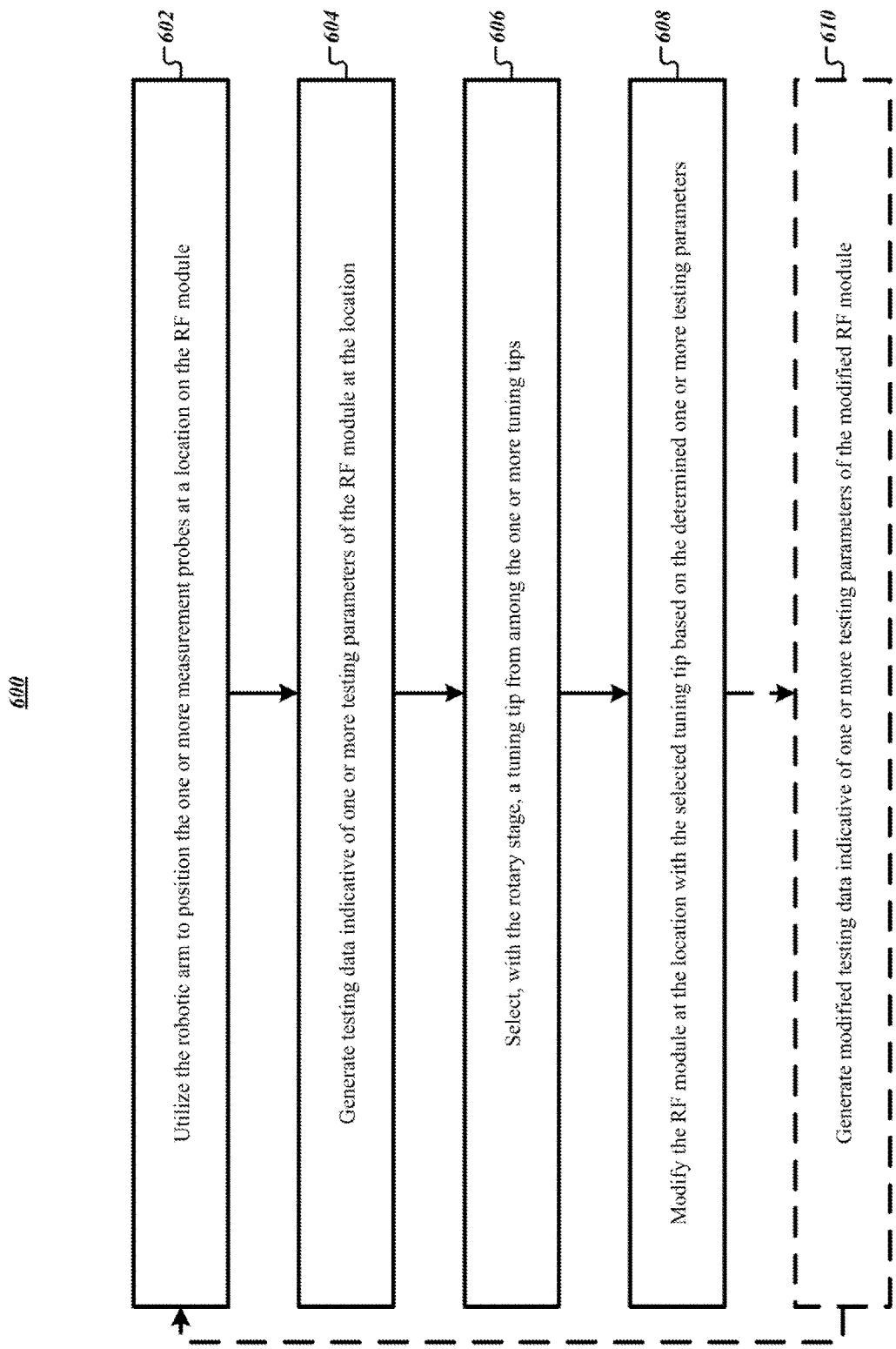
FIG. 6 illustrates example testing and tuning operations of an RF module in accordance with some example embodiments described herein.

FIG. 6 illustrates example testing and tuning operations of the method of FIG. 5 in accordance with some example embodiments described herein. The operations of FIG. 6 may allow a technician to utilize the ART system 100 for technician guided testing and tuning of a RF module 400. In various embodiments, this may include the ART system 100 acting as the hands and/or eyes of the technician, such as by use with the robotic arm 110, imaging device 114, galvo scanner 116, and laser.

At operation 602, a technician may utilize the robotic arm 110 to position the one or more measurement probes at a location on the RF module 400. After a RF module 400 has been loaded, a technician may provide input (e.g., a first input) to the ART system 100 to use the robotic arm 110 to select and position one or more measurement probes at a desired location on the RF module 400. This first input may include one input to select an operation (e.g., clicking on a radio box or selecting an item from a dropdown menu or list) or the input may include a plurality of inputs that provide specific instructions for operation of the ART system 100 (e.g., inputting multiple coordinates of locations and individual commands for operating the robotic arm 110 and rotary stage 116). The ART system 100 may receive the input, for example, via a keyboard, keypad, mouse, touchscreen display, etc. With the input, a technician may select a measurement probe and guide the measurement probe with the robotic arm 110 to a location to be tested. After a measurement probe is placed at a specified location, one or more tests may be performed by the ART system 100, such as with a measurement device of the electronic test equipment 106 connected with the measurement probe.

In various embodiments, the utilization of the robotic arm 110 may include a display of a representation of the RF module 400. For example, the ART system 100 may include a display that renders a 2D or 3D representation of the RF module 400 under test or one or more images captured of the RF module 400 under test. The rendering may include a schematic, such as a CAD drawing. In various embodiments, an image and a CAD drawing may be displayed simultaneously, such as in a side-by-side display or in an overlay, including a CAD drawing overlaying an image. In various embodiments, a side-by-side display may include displaying an overlay of a captured image before tuning on a first side of the display and displaying an overlay of a captured image after tuning on a second side of the display.

At operation 604, the ART system 110 may generate testing data indicative of one or more testing parameters of the RF module 400 at the location. A technician may, once one or more measurement probes have been positioned, execute a test operation. The ART system 100 may generate testing data indicative of the parameter being tested for. The testing data may be used to determine if the RF module passes one or more tests. If, based on the testing data, an indication that tuning is needed is determined, a technician may tune the RF module using the ART system 100.

At operation 606, a technician may select, with the rotary stage 116, a tuning tip from among the one or more tuning tips. A technician may provide input (e.g., a second input) to the ART system 100 to use the robotic arm 110 and the tuning tips to tune the RF module 400, such as with additive and/or subtractive tuning. This second input may include one input to select an operation (e.g., clicking on a radio box or selecting an item from a dropdown menu or list) or the input may include a plurality of inputs that provide specific instructions for operation of the ART system 100 (e.g., inputting multiple coordinates and individual commands for operating the robotic arm 110 and rotary stage 116). For example, with additive tuning, a technician may select a tuning tip to apply an epoxy daub. The technician may select the type of daubing material, and the ART system 100 may execute applying the daubing material.

At operation 608, the ART system may modify the RF module 400 at the location with the selected tuning tip based on the determined one or more testing parameters. For example, this may include, but is not limited to, adding material with a tuning tip and/or removing material with a laser.

In various embodiments, the tuning operation may be an additive tuning operation. For example, the ART system 100 may position the tuning tip with the daubing material at the specified location, such as specified by a technician with an input, and apply the daub to the RF module 400. The application of the daubing material may change the impedance at or near the location the epoxy is applied, which may change the transfer function of the RF module 400. The size of the daub may cause the change in impedance to be greater or lesser. Thus the size of the daub may be altered to tune to an RF module 400. In various embodiments, daubing may be used to join one or more traces, such as to cause a short or provide a low impedance path. With the change in impedance in one location, additional tuning may be needed as the impedance changes the transfer function as may be measured during a testing operation.

In various embodiments, the tuning operation may be a subtractive tuning operation. This may include, but is not limited to, laser ablation, weld tuning, pulling a jumper, or cutting a bond. For example, a laser may be used to ablate one or more portions of traces on a substrate. In another example, laser ablation may remove a trace and, thus, change the impedance or create an open circuit. For example, a ladder connector may have a rung be removed with laser ablation. In another example, a laser may be used to weld tune by welding two or more materials together.

At operation 610, the ART system 100 may generate testing data indicative of one or more testing parameters of the modified RF module 400. In various embodiments, after each tuning operation, the ART system 100 may generate additional testing data to determine if the tunning caused the RF module 400 to pass the test. If the tuned RF module 400 passes a first test but may need to be tested for another parameter, the technician may return to a prior operation, such as operation 602, to place a measurement probe in another location. Thus, after the ART system 100 performs operations of process 600 of FIG. 6 at a first location, the ART system 100 may iterate one or more of the operations as described herein, such as at additional locations.

In various embodiments, iteratively testing and tuning an RF module 400 may include additive tuning and subtractive tuning. For example, a technician may load an RF module 400 including multiple traces. The ART system 100 may be used to test the RF module 400 at a plurality of locations. The testing at each of the location may generate different testing data, and variations in the testing data may be associated with where a tuning operation may be executed. For example, the amount of variation at a location from a threshold or range may indicate where to perform a tuning operation, which may be referred to as a parameter threshold (s). In various embodiments, a location with testing data that fails a test but is the closest to passing a test may be chosen as the location to tune. The technician may use the ART system 100 to tune the RF module 400 at a plurality of these locations. This tuning may include additive tuning of adding epoxy to multiple locations and subtracting one or more portions of traces and/or epoxy daubs to alter the impedance of the RF module 400. In various embodiments, the daubing of epoxy may be first with a small amount and then with a larger amount. The technician may use the ART system 100 to select larger and larger daubing by changing the tuning tip and/or the amount of daubing material to use. The amount of daubing material may be changed by selecting a different tuning tip and/or by dipping a tuning tip into a greater amount of daubing material. The amount of daubing material and the amount of pressure applied to a location of the RF module 400 may change the amount of daubing material added. Additionally, or alternatively, the angle and/or height may be controlled to further control the amount of daubing material to apply.

Figure 7:
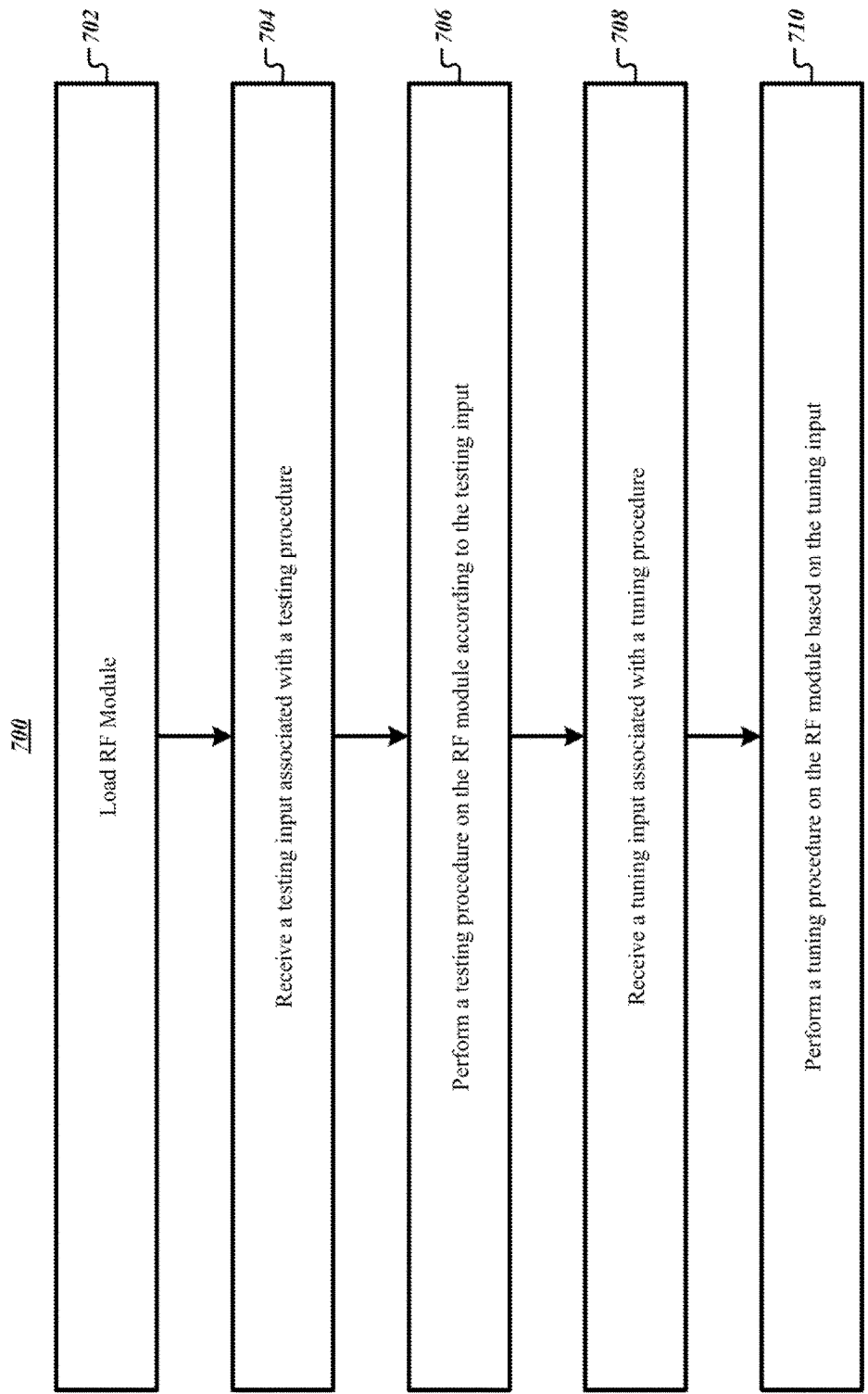
FIG. 7 illustrates additional example testing and tuning operations of an RF module in accordance with some example embodiments described herein.

FIG. 7 illustrates another example method of testing and tuning an RF module in accordance with some example embodiments described herein. The ART system 100 may allow a technician to use the ART system 100 to semi-autonomously test and tune an RF module 400. In various embodiments, this may include the ART system 100 acting as the hands and/or eyes of the technician and also providing one or more suggestions and/or automated procedures to be executed with a technician's guidance. In various embodiments, semi-autonomous operations may be based on one or more testing and/or tuning algorithms. An algorithm may include all of the operations associated with a procedure, or an algorithm may include some operations associated with a portion of a procedure, such as addressing specific types of testing or tuning.

At operation 702, the ART system 100 may load an RF module 400, which is described herein. In various embodiments, a technician or an autoloader may load an RF module 400. A technician may provide one or more inputs that may be associated with one or more algorithms for testing and/or tuning the RF module 400. In various embodiments, the ART system 100 may render one or more suggestions a technician may decide from on a display, such as one or more indications of testing and/or tuning operations to be performed. A technician may select the one or more indications by providing an input. The input may be associated with the type of RF module 400, which may be associated with one or more testing and/or tuning algorithms previously associated with the type of RF module. In various embodiments, the selections may include thresholds and or ranges as well as associated values. In various embodiments, the ART system 100 may automatically select testing operations and/or tuning operations based on the input from the technician. In various embodiments the ART system 100 may identify the RF module 400 with the imaging devices 114 and one or more testing operations and/or tuning operations automatically based on the identification. In various embodiments, the ART system 100 may automatically move one or more measurement probes and/or tuning tips to one or more locations, which may be predetermined locations based on an algorithm or may be determined according to an algorithm.

At operation 704, the ART system may receive a testing input associated with a testing procedure. In various embodiments, the testing input may be associated with an indication of a testing operation that is generated by the ART system 100 and rendered on a display to a technician. For example, the ART system 100 may have one or more testing operations associated with a testing algorithm, and the testing operations may be suggested to a technician on the display. The technician may provide an input of a testing indication to provide the ART system 100 with the operation (s) the ART system 100 will proceed to next. In such exemplary embodiments, the ART system 100 may be semi-autonomously performing testing procedures by having a technician provide an input, such as in response to a suggestion, to determine which test procedure(s) to execute and then executing the test procedure(s) accordingly.

In various embodiments, the input may be selected from a user interface. The user interface may include one or more dropdown menus or lists from which a technician may select from to make the input of an indication of testing operations to perform. Other user display interfaces may include check boxes of locations to test. In various embodiments, a display may include an image rendering with a CAD schematic overlay and a technician may indicate one or more locations with input of locations on the rendering for where to perform one or more testing procedures.

At operation 706, the ART system 100 may perform a testing procedure on the RF module 400 associated with the testing input. Based on the input from the technician, the ART system 100 may perform one or more testing operations. The testing operations may be executed without further input from a technician, though the ART system 100 may render testing data on a display to visualize the process and results of the one or more testing operations.

In an exemplary embodiment, the ART system 100 may execute one or more test procedures based on the technician input according to one or more testing algorithms, which may also utilize the technician input, such as locations. In various embodiments, such as testing using time domain reflectometry, the electronic test equipment 106 may apply a signal via a port of an RF module 400 and the robotic arm 110 may be used to select and place a measurement probe 120 at one or more locations according to the testing algorithm. The ART system 100 may test each location in order to determine if the RF module 400 under test passes the test or if tuning may be needed. Alternatively, various embodiments may test locations that have been arranged into multiple groupings, which may be based on a suspected probability of where a RF module 400 may be most likely to be tuned. Such groupings may be for suspected hot spots. In various embodiments, the groupings may be determined based on metadata associated with the RF module 400, such as based on stored data associated with an identifier determined from one or more of the fiducials 406A, 406B. The grouping may be tested one at a time in order to lower the amount of time of testing procedures. In various embodiments, the groupings and/or associated suspected probability may be input or selected by a technician, such as during the technician input described above. As the groupings of locations are tested, if a location or locations are determined that may need to be tuned, the ART system 100 may generate an indication of a location to be tuned to be suggested and displayed to a technician.

In various embodiments, the indication of a location to be tuned may be based on past experience, which may have been stored previously by the ART system 100. Thus the indication of a location to be tuned may be based on stored data related to how previous testing data associated with the improvement of a different RF module 400 improved before and after tuning one or more locations.

At operation 708, the ART system 100 may receive a tuning input associated with a tuning procedure. The ART system 100 may, after determining that an RF module 400 does not pass all tests and needs to be tuned, request technician input associated with one or more tuning procedures. In requesting technician input, the ART system 100 may display the tuning operation and associated location(s) and, additionally, estimated improvement thresholds may be displayed. This display may include a suggestion. A technician may then provide a tuning input in response to provide an indication of the tuning operations for the ART system to execute.

In various embodiments, a technician may be provided a suggestion via a display prior to all possible testing operations having been executed. The technician may choose not to indicate a tuning operation but instead provide input of carrying out further testing operations. This input may be an input indicative of rejecting the present suggestions. In various embodiments, the technician may provide additional locations for testing that were not previously tested, which may include a ranking or ordering of locations to be tested. In response, the ART system 100 may perform further testing operations to identify additional tuning operations that may be presented to a technician via a display.

In various embodiments, a technician may not approve the one or more suggestions and may manually perform one or more tuning operations. The technician may perform manual tuning operations as described herein. After such manual tuning, the technician may manually test the RF module 400 or may have the ART system 100 perform one or more testing operations semi-autonomously or autonomously.

At operation 710, the ART system may perform a tuning procedure on the RF module based on the tuning input. The tuning operation(s) of the tuning procedure may be executed by the ART system 100 similarly as described herein (e.g., select a location, select a tuning tip, perform tuning operation, etc.) but may be done according to tuning algorithm without further technician input.

During the testing and tuning, or subsequent to the testing and tuning, the ART system 100 may store testing data and tuning data associated with the testing and tuning of the RF module 400. This testing data and tuning data may include, but is not limited to, testing operations executed, testing data, suggestions presented to a technician, technician input, tuning data, etc. The ART system 100 may utilize this testing data and tuning data to refine or develop testing algorithms and tuning algorithms, including by use of simulations and/or machine learning.

In an exemplary embodiment of the semi-autonomous testing and tuning, a technician may load an RF module 400 to ART system 100. The ART system 100 may use an imaging device 114 to capture an image of the RF module 400, including a fiducial 406. The ART system 100 may use optical character recognition with the image capture of the fiducial 406 to determine an identifier (e.g., a serial number) of the RF module 400. Based on the identifier, the ART system 100 may determine one or more tests, testing algorithms, and/or tuning algorithms that may be used with the RF module 400. The ART system 100 may display to a technician one or more tests to be executed along with one or more locations for each test. The technician may provide input of the tests to be executed, including an ordering of the tests and any groupings of locations, which may be an approval of orderings and groupings that the ART system 100 may have suggested. The testing input may also include if the ART system 100 is to execute one test at a time or execute all tests at once before requesting additional input from the technician. Once the ART system 100 has executed the indicated tests, if the RF module passes the tests then it may be unloaded. If the RF module does not pass the tests, the ART system 100 may display one or more suggestions, including one or more tuning operations that may be executed along with associated locations. The ART system 100 may also display an improvement threshold that the ART system 100 estimates to be the amount of improvement to one or more parameters tested for based on the tuning operation. The improvement threshold may be based on past testing data and tuning data, machine learning, and/or simulations. The technician may provide input indicating the tuning operations to be executed, and the ART system 100 may execute the tuning operations. After performing a tuning operation, or after executing all of the tuning operations, the ART system 100 may iterate one or more testing operations to determine if the tuned RF module 400 passes tests.

Figure 8:
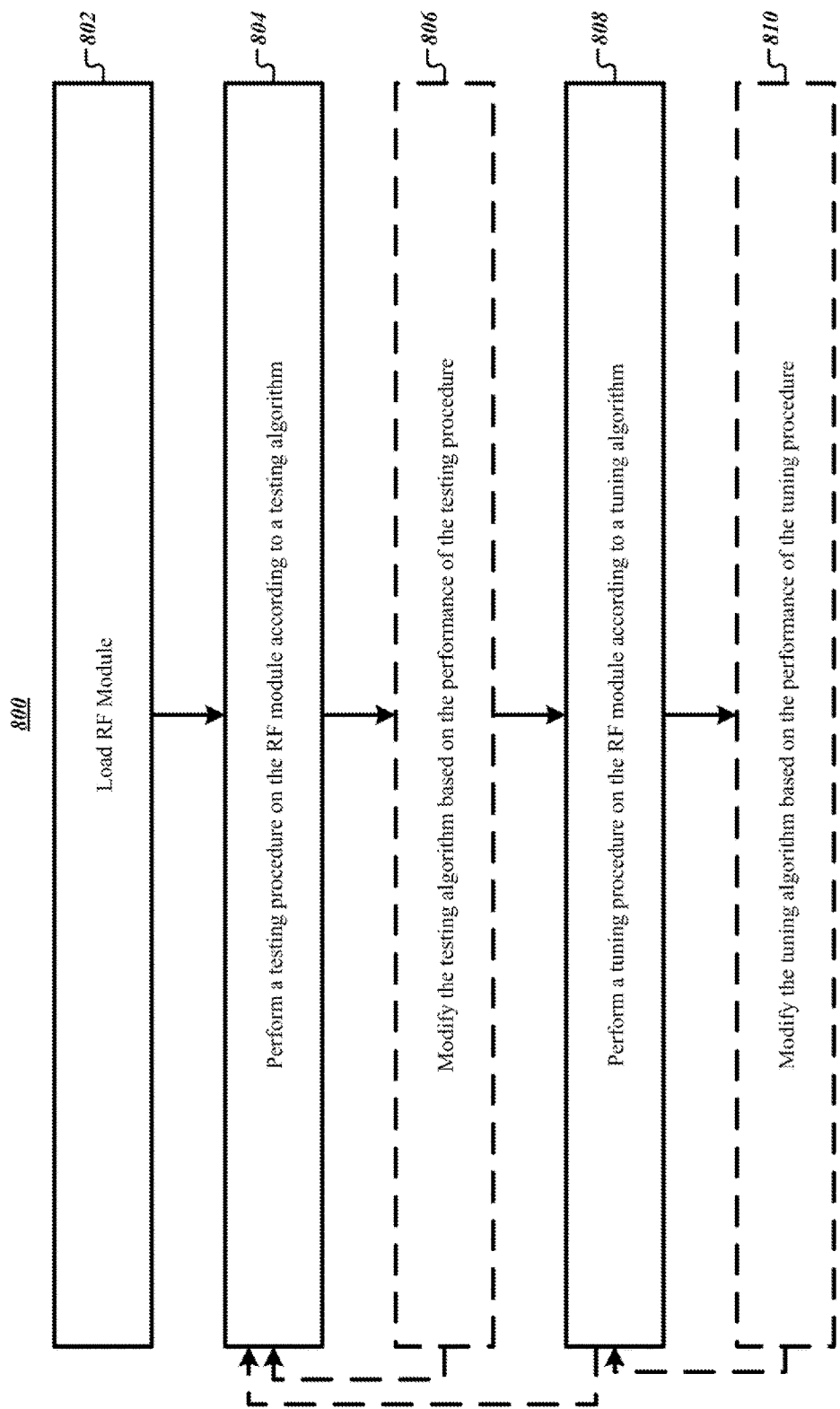
FIG. 8 illustrates additional example testing and tuning operations of an RF module with a testing algorithm and a tuning algorithm in accordance with some example embodiments described herein.

FIG. 8 illustrates another example method of testing and tuning an RF module in accordance with some embodiments described herein. The ART system 100 may allow for testing using a tuning algorithm and tuning using a tuning algorithm in a fully autonomous manner such that a technician is not required to test and tune an RF module 400. Thus the ART system 100 may allow for fully autonomous testing and tuning of an RF module 400. In various embodiments, this may include an RF module 400 being loaded and executing one or more testing and/or tuning operations without requiring a technician's input. In various embodiments, however, the fully autonomous ART system 100 may include alerting a technician for intervention. In various embodiments, the one or more algorithms associated with testing and/or tuning may by dynamically and/or iteratively updated based on testing and/or tuning data generated and stored by the ART system 100. The updating may be based on simulations and/or machine learning.

At operation 802, the ART system 100 may load an RF module 400. In various embodiments, a technician or an autoloader may load an RF module 400 to the ART system 100. A technician may provide one or more inputs to initiate the ART system 100 or, alternatively, the loading of the RF module 400 may cause the ART system 100 to proceed with testing and tuning without a technician's input. In various embodiments the ART system 100 may identify the RF module 400 with the imaging devices 114 and one or more testing operations and/or tuning operations automatically based on the identification. In various embodiments, the ART system 100 may automatically move one or more measurement probes and/or tuning tips to one or more locations, which may be predetermined locations based on an algorithm or may be determined according to an algorithm. In various embodiments, the ART system 100 may display testing data and/or tuning data on a display while the ART system 100 is executing testing and/or tuning operations.

At operation 804, the ART system may perform a testing procedure on the RF module 400 according to a testing algorithm. The testing procedure, including the one or more testing operations included in the testing procedure, may be determined by the ART system 100 based on an identifier associated with a fiducial 406 of the RF module 400. The ART system 100 may use an imaging device 114 to capture an image of the RF module 400 and recognize an identifier in or associated with the fiducial 406. The testing procedure may be determined by the ART system 100, and the testing procedure may include one or more testing operations to be executed. Whereas in some embodiments a technician may have provided input to direct the testing, in the fully autonomous embodiment the testing algorithm may provide the input data or contain the input data needed to execute one or more testing operations. The ART system 100 may execute the testing operations to perform one or more tests on the RF module 400 to generate testing data, which will be used to determine if the RF module 400 passes the tests or not.

At operation 806, the ART system 100 may modify the testing algorithm based on performance of the testing procedure. The testing data generated from performance of the testing procedure may be stored. That stored data may be provided to a simulation or a machine learning algorithm to modify the testing algorithm. In embodiments with multiple test stations 102, the testing data from multiple test stations 102 for testing multiple RF modules 400 may be collectively used in modifying a testing algorithm. In an embodiment where the testing algorithm is modified, the ART system 100 may iterate one or more testing operations in accordance with a modification to the testing procedure.

At operation 808, the ART system 100 may perform a tuning procedure on the RF module 400 according to a tuning algorithm. The tuning procedure, including the one or more tuning operations included in the tuning procedure, may be determined by the ART system 100 based on the identifier associated with a fiducial 406 of the RF module 400. The ART system 100 may execute the tuning operations to perform one or more modifications to the RF module 400.

At operation 810, the ART system may modify the tuning algorithm based on performance of the tuning procedure.

Additional testing data may be generated after one or more tuning operations is executed. The testing data associated with the modified RF module may be stored and used to modify the tuning algorithm. That stored data may be provided to a simulation or a machine learning algorithm to modify the tuning algorithm.

In various embodiments, the fully autonomous ART system 100 may test and tune one location at a time or may test a plurality of locations before selecting one or more locations to tune.

In an exemplary embodiment, an ART system 100 may test a first location based on a testing algorithm to generate testing data for one or more parameters. The ART system 100 may use the robotic arm 110 and measurement probes to execute a testing operation as described herein. If the testing data deviates from a parameter threshold, such as being above (or below) a threshold or is outside (or inside) a range, such that a test is not passed, the ART system 100 may then perform a tuning operation. The tuning operation may be determined and selected by the ART system 100 based on the tuning algorithm, which may be based on the parameter tested for, the amount the parameter deviates from specification, and an estimated improvement threshold associated with the tuning operation. The ART system 100 may use the robotic arm 110 and tuning tips to execute a tuning operation as described herein. The ART system 100 may then test the RF module 400 again to determine if the RF module 400 now passes the tests or if additional tuning operations are to be performed. The ART system 100 may iterate through testing and tuning operations to tune the RF module 400 to be within specification.

In another exemplary embodiment, an ART system 100 may test a plurality of locations based on a testing algorithm to generate testing data for one or more parameters. The ART system 100 may use the robotic arm 110 and measurement probes to execute a testing operation as described herein. After all of the locations to be tested have been tested, if the testing data deviates from a parameter threshold, such as being above (or below) a threshold or is outside (or inside) a range, such that a test associated with a parameter is not passed, the ART system 100 may then perform one or more tuning operations as described herein. The tuning operations may be determined and selected by the ART system 100 based on the tuning algorithm, which may be based on the parameter tested for, the amount the parameter deviates from specification, and an estimated improvement threshold associated with the tuning operation. As a tuning operation may modify the RF module 400 and change the parameters in the test results or testing data for multiple parameters, the ART system 100 may select one or more tuning operations based on how one or more parameters may be changed due to the tuning operation(s). The ART system 100 may use the robotic arm and tuning tips to execute the tuning operation(s) as described herein. The ART system 100 may then test the RF module 400 again to determine if the RF module now passes the tests or if additional tuning operations are to be performed. The ART system 100 may iterate through testing and tuning operations to tune the RF module 400 to be within specification.

In various embodiments, an ART system 100 may encounter an error or circumstance that deviates from the testing algorithm such that a technician is needed. For example, a measurement probe or tuning tip may not be functioning. Alternatively, or additionally, the locations and operations associated with the operations may not tune an RF module 400 to the required specification. Thus an error or an alert may be generated. The error or alert may be indicated on the display and/or an electronic communication may be generated to send to a technician along with testing data and/or tuning data that led to the error. If a technician is able to resolve the issue associated with the error or alert, the testing data and/or tuning data may include what operations were performed to address the error or alert, which may be used to modify a testing algorithm or a tuning algorithm.

In various embodiments, a testing algorithm and/or a tuning algorithm may be modified by the ART system 100 by one or more simulations. The algorithm may be updated based on testing data and/or tuning data generated during the testing and tuning of an RF module 400. The algorithm update may occur in real-time as data (e.g., testing data) is generated, or an update may occur each time the testing and/or tuning of an RF module 400 is completed or an update may occur after a certain number of RF modules 400 are tested and/or tuned. A real-time update may include a simulation incorporating real-time testing data as testing data is generated by the ART system 100, and the simulation may be updated based on newly received real-time testing data.

An exemplary embodiment of an update via a simulation may include a simulation of the RF module 400. The simulation may be based on a preexisting model of an RF module 400 or may be based on a model generated by the ART system 100, such as based on one or more images captured by the imaging device 114. Additionally, the simulated model may be modified based on an image captured, by testing data, and/or by tuning data. Thus, a simulation may include actual testing data as measured by the ART system 100. A simulation may be run to simulate a transfer function or response of the simulated model RF module 400 that simulates one or more tests. The simulation may include modifying the simulated model of the RF module 400 with one or more tuning operations (e.g., additive tuning, substrative tuning) in one or more locations. The simulation may include iterating the tuning operations at multiple locations. The simulation may be run or iterated until an optimized solution is determined by the simulation for the simulated model of the RF module 400. An optimized solution may be a simulated model of RF module 400 that passes all of the simulated tests, including a solution that provides passing the simulated tests with the greatest(s) margin(s) for each parameter tested or simulated. In various embodiments, a simulation may be updated in real-time as the ART system 100 may perform a tuning operation, including the ART system 100 performing a tuning operation and taking a subsequent measurement(s) to generate testing data, which is provided to the simulation to incorporate.

A simulation may be used to update or revise a testing algorithm or tuning algorithm based on the simulation. The simulation's revisions of a testing algorithm may include updating or revising one or more test criteria, including a threshold, range, location(s), testing signal, or the like. The ART system 100, on updating an algorithm, may execute or re-execute one or more testing operations.

In various embodiments, a simulation may be run if a testing algorithm and a tuning algorithm are executed but an RF module 400 does not pass one or more tests. The simulation may incorporate testing data, and it may simulate tuning operations to determine modifications to the RF module 400 to pass the test. Such revisions to the tuning operations may include changing one or more portions of a tuning operation, such as changing the amount of a daubing material or the amount of material to be ablated.

In various embodiments, if one or more simulations have been run and no revisions to one or more algorithms have been generated, the ART system 100 may generate an alert for a technician.

In various embodiments, prior to an RF module 400 is being manufactured, testing data associated with the components that will be used to manufacture the RF module 400 may be received or generated, such as from a test of the components. Components may be associated with an acceptable range of component values from a manufacturer, but the actual components may have specific values that may be tested for and incorporated into the simulation. Similarly, the manufacturing of an RF module 400 may result in variations in a first RF module 400 that are different from a second RF module 400, such as in one or more bond lengths. The manufacturing process may generate testing data, such as of these variations. Testing data may be input into a simulation of the RF module 400, which may be used to generate testing operations and/or tuning operations to test and tune the RF module 400 that will be manufactured or was manufactured with the components received. These operations may be associated with an identifier of the RF module 400, and then used by the ART system 100 to test and tune the RF module 400. The simulation may thus be unique or tailored to the RF module 400 and the testing operations and/or the tuning operations may be unique or trailer the RF module 400. Such simulations provide improvements by using measured values instead of estimated ranges that are common to simulations.

In various simulations, the simulated RF module 400 may include a 3D simulation of the RF module 400.

In various embodiments, a simulated RF module 400 may be tuned by a technician or a technician in a simulation environment, which may be referred to as a pre-tune. One or more testing and/or tuning operations to be performed on the manufactured RF module 400 may be performed in the simulation environment by a technician. The pre-tune may be performed by technician either directly at the ART system 100 or by a technician remotely, and the pre-tune may generate one or more testing operations and/or tuning operations to be performed by the ART system 100 on the manufactured RF module 400.

In various embodiments, a simulation environment may provide training to a technician. The training simulation may involve testing and tuning an RF module 400 as described herein, including to generate testing data and executing tuning operations.

In various embodiments, a simulation may receive testing data for an RF module 400 under test and the simulated parameters may deviate from the testing data received. The simulation may iterate through one or more revisions to the simulation, such as adjusting component values or modifying the simulation based on one or more images captured of the RF module 400, to match the testing data. The simulation may include an estimated or pre-set value for one or more components. Iterations may include, for example, adjusting a value or value range of one or more components. In this manner, a simulation may be used to match or modify a simulation to the testing data of an RF module 400 under test.

In various embodiments, a machine learning model may be used to generate and/or revise one or more testing operations and/or tuning operations. A machine learning model may be trained with a training data set, which may include images captured by the ART system 100, testing data, tuning data, simulation output, testing algorithms, tuning algorithms, and the like. The training data set may train the machine learning model to generate testing operations and/or tuning operations that may be executed.

In various embodiments, the machine learning model may be trained based on data sets of images captured by imaging device(s) 114, such as historical images. The historical images may be before and after tuning of an RF model. The machine learning model may include optical recognition, which may be used to determine locations and tuning operations. A location may be determined based on the location of a tuning in relation to a fiducial, which may allow for accuracy to within half a micron. The machine learning model may be used to generate or revise a tuning algorithm, including one or more tuning operations to execute and locations for the tuning operation(s).

In various embodiments, the machine learning model may be trained based on historical images, testing data, and tuning data. The historical images may be before and after tuning of an RF model, and the testing data and tuning data may be associated with the historical images. Based on the training data set(s), the ART system 100 may generate algorithms with multiple tuning operations that include test results or discrete measurement testing values for one or more parameters for before and after each tuning operation. The machine learning model may be used to generate or revise a tuning algorithm, including one or more tuning operations to execute and locations for the tuning operation (s).

A tuning algorithm, such as one generated by a simulation and/or a machine learning model, may include one or more testing values to associate after each tuning operation so that the ART system 100 may confirm with testing data that a tuning algorithm is generating modifications that, after completion of the algorithm, will result in an RF module 400 that will pass one or more tests. Alternatively, or additionally, the one or more testing values may be for after one or more tuning operations have been performed, such that multiple tuning operations may occur before the ART system 100 would execute one or more testing operations to generate testing data to compare against what was simulated or output by a machine learning model.

In various embodiments, machine learning may be used in conjunction with a simulation. The machine learning model may include an input and/or training data sets of testing data, tuning data, and simulation data to generate testing operations and/or tuning operations, which may include one or more additional locations to test and/or tune.

In an exemplary embodiment, the ART system 100 may use a simulation to generate a 3D representation of a RF module 400 to be manufactured. The simulation may also generate one or more data objects including simulated testing data associated with the RF module 400 and one or more tuning operations to be executed to tune the RF module 400. The fully autonomous ART system 100 may be used to test and tune the RF module 400. A technician may load a manufactured RF module 400 having a fiducial. The ART system 100 may, with an imaging device 114, capture an image of the RF module 400, including its fiducial. The ART system 100 may recognize an identifier from the fiducial. Based on the identifier, the ART system 100 may determine the simulated RF module 400 associated with the identifier. The simulated RF module 400 may be associated with testing procedures and tuning procedures, including testing operations, and tuning operations, to be executed. The ART system 100 may execute the testing operations and, after each testing operations or after all of the testing operations, compare the testing data generated with the simulated testing data. The ART system 100 may, if the simulated testing data does not match the testing data generated, revise the simulation as described herein and revise the testing procedure and/or tuning procedure. The ART system 100 may execute one or more tuning operations according to the tuning procedure. The ART system 100 may further execute one or more tests after a tuning operation has been executed. After the RF module 400 has been tuned, the ART system 100 may unload the tuned RF module 400 or generate an alert for a technician to unload the RF module 400.

In various embodiments, the simulation(s) and machine learning model(s) may be executed in the ART system 100. Alternatively, the simulation(s) and/or machine learning model(s) may executed in a remote computing device 200 that is in communication with the ART system 100, and the ART system 100 may communicate with the remote computing device 200 with data objects containing, for example, simulations, simulation inputs, simulation outputs, machine learning models, training data sets, machine learning model inputs, machine learning model outputs, and the like.

CONCLUSION

Although exemplary systems and exemplary methods have been described herein, implementations or embodiments of the subject matter and the operations described herein can be implemented in other types of digital electronic circuitry, computer software or program, firmware, or hardware, including the structures disclosed in this specification and their structural equivalents, or in combinations of one or more of them.

Embodiments of the subject matter described herein can be implemented as one or more computer programs, i.e., one or more modules of computer program instructions, encoded on computer storage medium for execution by, or to control the operation of, information/data processing apparatus. Alternatively, or in addition, the program instructions can be encoded on an artificially-generated propagated signal, e.g., a machine-generated electrical, optical, or electromagnetic signal, which is generated to encode information/data for transmission to suitable receiver apparatus for execution by an information/data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described herein can be implemented as operations performed by an information/data processing apparatus on information/data stored on one or more computer-readable storage devices or received from other sources.

The term "data processing apparatus" as used above encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a repository management system, an operating system, a cross-platform runtime environment, a virtual machine, or a combination of one or more of them. The apparatus and execution environment can realize various different computing model infrastructures, such as web services, distributed computing, and grid computing infrastructures.

Computer software or computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A computer program can be stored in a portion of a file that holds other programs or information/data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described herein can be performed by one or more programmable processors executing one or more computer programs to perform actions by operating on input information/data and generating output. Processors suitable for the execution of a computer program include, by way of example, both general and special purpose microprocessors, and any one or more processors of any kind of digital computer. Generally, a processor will receive instructions and information/data from a read-only memory or a random access memory or both. The essential elements of a computer are a processor for performing actions in accordance with instructions and one or more memory devices for storing instructions and data. Generally, a computer will also include, or be operatively coupled to receive information/data from or transfer information/data to, or both, one or more mass storage devices for storing data, e.g., magnetic, magneto-optical disks, or optical disks. However, a computer need not have such devices. Devices suitable for storing computer program instructions and information/data include all forms of non-volatile memory, media, and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a technician, embodiments of the subject matter described herein can be implemented on a computer having a display device, e.g., a CRT (cathode ray tube) or LCD (liquid crystal display) monitor, for displaying information/data to the technician and a keyboard and a pointing device, e.g., a mouse or a trackball, by which the technician can provide input to the computer. Other kinds of devices can be used to provide for interaction with a technician as well; for example, feedback provided to the technician can be any form of sensory feedback, e.g., visual feedback, auditory feedback, or tactile feedback; and input from the technician can be received in any form, including acoustic, speech, or tactile input. In addition, a computer can interact with a technician by sending documents to and receiving documents from a device that is used by the technician; for example, by sending web pages to a web browser on a user device in response to requests received from the web browser.

Embodiments of the subject matter described herein can be implemented in a computing system that includes a back-end component, e.g., as an information/data server, or that includes a middleware component, e.g., an application server, or that includes a front-end component, e.g., a client computer having a graphical user interface or a web browser through which a technician can interact with an implementation of the subject matter described herein, or any combination of one or more such back-end, middleware, or front-end components. The components of the system can be interconnected by any form or medium of digital information/data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits information/data (e.g., an HTML page) to a user device (e.g., for purposes of displaying information/data to and receiving technician input from a technician interacting with the user device). Information/data generated at the user device (e.g., a result of the technician interaction) can be received from the user device at the server.

While this specification contains many specific implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described herein as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order illustrated or in sequential order, or that all illustrated operations be performed, to achieve desirable results. In certain circumstances, multitasking and parallel processing may be advantageous. Moreover, the separation of various system components in the embodiments described herein should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order illustrated, or sequential order, to achieve desirable results. In certain implementations, multitasking and parallel processing may be advantageous.

The invention claimed is:

1. A system for tuning a radiofrequency (RF) module, the system comprising:
   a test station comprising:
      an imaging device;
      a measurement device;
      a robotic arm;
      a galvo scanner;
      a laser;
      a rotary stage coupled with the robotic arm;
      one or more measurement probes supported by the rotary stage and operably coupled with the measurement device; and
      one or more tuning tips supported by the rotary stage;
   wherein, in operation, the test station is configured to:
      perform a testing procedure on an RF module received by the test station according to a testing algorithm in which the one or more measurement probes generate testing data indicative of one or more testing parameters of the RF module; and
      perform a tuning procedure on the RF module according to a tuning algorithm in which:
         a tuning tip of the one or more tuning tips is selected on the rotary stage; and
         the RF module is modified by the selected tuning tip.

2. The system according to claim 1, wherein the testing algorithm determines one or more locations of the RF module at which to perfume the testing procedure.

3. The system according to claim 2, wherein the test station, in performing the testing procedure, is further configured to utilize the robotic arm to position the one or more measurement probes at the one or more locations on the RF module determined by the testing algorithm.

4. The system according to claim 1, wherein, in performing the tuning procedure, the tuning algorithm determines the tuning tip.

5. The system according to claim 1, wherein the test station, in performing the tuning procedure, is further configured to:
   compare the testing data with one or more parameter thresholds; and
   modify the RF module according to the tuning algorithm in an instance in which the testing data fails to satisfy the one or more parameter thresholds.

6. The system according to claim 5, wherein the test station is further configured to:
   generate modified testing data indicative of one or more testing parameters of the modified RF module; and
   further modify the modified RF module according to the tuning algorithm in an instance in which the modified testing data fails to satisfy the one or more parameter thresholds.

7. The system according to claim 1, wherein the test station is further configured to modify the testing algorithm or the tuning algorithm based on a simulation.

8. The system according to claim 1, wherein the test station is further configured to modify the testing algorithm or the tuning algorithm based on a machine learning model.

9. The system according to claim 1, wherein the tuning procedure comprises an additive tuning procedure in which epoxy is deposited on the RF module.

10. The system according to claim 1, wherein the tuning procedure comprises a subtractive tuning procedure in which laser ablation removes at least a portion of the RF module.

11. A method for testing and tuning a radiofrequency (RF) module, the method comprising:
    providing an RF module to a test station comprising:
       an imaging device;
       a measurement device;
       a robotic arm;
       a galvo scanner;
       a laser;
       a rotary stage coupled with the robotic arm;
       one or more measurement probes disposed in the rotary stage and operably coupled with the measurement device; and
       one or more tuning tips disposed in the rotary stage;
    performing, by the test station, a testing procedure on an RF module received by the test station according to a testing algorithm in which the one or more measurement probes generate testing data indicative of one or more testing parameters of the RF module; and
    performing, by the test station, a tuning procedure on the RF module according to a tuning algorithm in which:
       a tuning tip of the one or more tuning tips is selected on the rotary stage; and
       the RF module is modified by the selected tuning tip.

12. The method according to claim 11, wherein the testing algorithm determines one or more locations of the RF module at which to perfume the testing procedure.

13. The method according to claim 12, wherein performing the testing procedure further comprises utilizing the robotic arm to position the one or more measurement probes at the one or more locations on the RF module determined by the testing algorithm.

14. The method according to claim 11, wherein, in performing the tuning procedure, the tuning algorithm determines the tuning tip.

15. The method according to claim 11, wherein performing the tuning procedure further comprises:
    comparing the testing data with one or more parameter thresholds; and
    modifying the RF module according to the tuning algorithm in an instance in which the testing data fails to satisfy the one or more parameter thresholds.

16. The method according to claim 15, further comprising:
    generating modified testing data indicative of one or more testing parameters of the modified RF module; and
    further modifying the modified RF module according to the tuning algorithm in an instance in which the modified testing data fails to satisfy the one or more parameter thresholds.

17. The method according to claim 11, further comprising modifying the testing algorithm or the tuning algorithm based on a simulation.

18. The method according to claim 11, further comprising modifying the testing algorithm or the tuning algorithm based on a machine learning model.

19. The method according to claim 11, wherein the tuning procedure comprises an additive tuning procedure comprising depositing metal or epoxy on the RF module.

20. The method according to claim 11, wherein the tuning procedure comprises a subtractive tuning procedure comprising removing via laser ablation at least a portion of the RF module.

* * * * *